(12) United States Patent
Wang et al.

(10) Patent No.: US 12,118,276 B2
(45) Date of Patent: Oct. 15, 2024

(54) METHOD FOR RECKONING ENVIRONMENTAL BACKGROUND WATER TEMPERATURE AND CALCULATING TEMPERATURE RISE IN TEMPERATURE RISE AREA OF NEWLY-BUILT COASTAL POWER PLANT

(71) Applicants: FIRST INSTITUTE OF OCEANOGRAPHY, MINISTRY OF NATURAL RESOURCES, Qingdao (CN); QINGDAO GUOHAIHAOHAN OCEAN ENGINEERING CONSULTING CO. LTD, Qingdao (CN)

(72) Inventors: Yongzhi Wang, Qingdao (CN); Shuangwen Sun, Qingdao (CN); Peng Ji, Qingdao (CN); Jun Du, Qingdao (CN); Ziwen Tian, Qingdao (CN); Huifeng Sun, Qingdao (CN)

(73) Assignees: FIRST INSTITUTE OF OCEANOGRAPHY, MINISTRY OF NATURAL RESOURCES, Shandong (CN); QINGDAO GUOHAIHAOHAN OCEAN ENGINEERING CONSULTING CO. LTD, Shandong (CN)

( * ) Notice: Subject to any disclaimer, the term of this patent is extended or adjusted under 35 U.S.C. 154(b) by 0 days.

(21) Appl. No.: 18/413,240

(22) Filed: Jan. 16, 2024

(65) Prior Publication Data
US 2024/0152662 A1 May 9, 2024

Related U.S. Application Data

(63) Continuation of application No. PCT/CN2023/111946, filed on Aug. 9, 2023.

(30) Foreign Application Priority Data

Jun. 10, 2022 (CN) .......................... 202210657450.2

(51) Int. Cl.
*G06F 30/13* (2020.01)

(52) U.S. Cl.
CPC .................................. *G06F 30/13* (2020.01)

(58) Field of Classification Search
CPC .......... G06F 30/20; G06F 30/28; G06Q 50/06
See application file for complete search history.

(56) References Cited

U.S. PATENT DOCUMENTS

2012/0078516 A1    3/2012   Yoshii

FOREIGN PATENT DOCUMENTS

| CN | 101551275 | 10/2009 |
| CN | 104730107 | 6/2015 |

(Continued)

OTHER PUBLICATIONS

CN 110298080 A Translation (Year: 2019).*

(Continued)

*Primary Examiner* — Schyler S Sanks
(74) *Attorney, Agent, or Firm* — Pilloff Passino & Cosenza LLP; Rachel K. Pilloff; Sean A. Passino

(57) ABSTRACT

A method for reckoning the environmental background water temperature and calculating the temperature rise in a temperature rise area of a newly-built coastal power plant is provided. The reckoning method includes: S01, before an operation of the newly-built coastal power plant, building a water temperature reference station; S02, continuously observing and recording water temperature data of the water temperature reference station and other water temperature observation stations; S03, analyzing the water temperature data obtained in S02; and S04, reckoning a sea surface (Continued)

natural water temperature of the other water temperature observation stations. A temperature rise calculation method includes: S01, reckoning the sea surface natural water temperature of other water temperature observation stations; S02, measuring an on-site absolute water temperature of the other water temperature observation stations; and S03, an actual temperature rise is a difference value between the on-site absolute water temperature and the sea surface natural water temperature.

7 Claims, 46 Drawing Sheets

(56) References Cited

FOREIGN PATENT DOCUMENTS

| | | | |
|---|---|---|---|
| CN | 104751252 | 7/2015 | |
| CN | 108981957 | 12/2018 | |
| CN | 109255158 | 1/2019 | |
| CN | 110298080 | 10/2019 | |
| CN | 110298080 A * | 10/2019 | ......... G06F 17/5009 |
| CN | 114399073 | 4/2022 | |
| CN | 15147239 | 10/2022 | |
| JP | H11148312 | 6/1999 | |
| JP | 2000298069 | 10/2000 | |
| JP | 2010121564 | 6/2010 | |
| JP | 2011002127 | 1/2011 | |
| JP | 2017048959 | 3/2017 | |
| TW | M524937 U | 2/2016 | |

OTHER PUBLICATIONS

Liu Si, et al., Distribution of temperature rise in the water body of a prototype observation environment of a coastal nuclear power plant, Water Supply and Drainage vol. 54, No. 447, pp. 188-193 (abstract translated).

Jun Lin, et al., Numerical simulation study on site selection evaluation of marine ranching zone in Xiangshan Bay : Effects of thermal water discharged from coastal power plants, Journal of Shanghai Ocean University, vol. 21, No. 9, pp. 816-824 (2012) (English translation on 824).

Xiaojing Zhang, China Excellent Master's Dissertation, Numerical Simulation of Thermal Drainage and Calculation of Thermal Environment Capacity in Zhangxiaojing Tidal Waters Power Plant, Full-text Database Engineering Technology Series 1, No. 09, pp. 1-78 (2015) (Abstract on III-V).

Yang Hongyan, et al., Remote sensing monitoring and environmental impact analysis of temperature and drainage in nuclear power plants, Environmental Protection, vol. 46, Issue 21 (2018), pp. 18-22 (abstract translated).

Li Zhiyong, et al., Study on the influence of temperature drainage on the temperature rise of water intake in Zhenhai power plant, The 11th issue of Thermal Power Generation (2009), pp. 57-60 (abstract translated).

De Tang, et al., The Investigation of Monitoring and Simulation Methods of Thermal Discharge from Costal Power Plant, J. Environmental Science Survey, vol. 36, No. 6 (2017), (2d English abstract at back).

Li Haibin, et al., Numerical simulation study on temperature and drainage of Shenzhen Qianwan gas turbine power plant phase II project, Guangdong Water Conservancy and Hydropower, No. 08 (2013), pp. 7-11.

First Office action from SIPO in 202210657450.2 dated Dec. 5, 2022.

Second Office action from SIPO in 202210657450.2 dated Jan. 5, 2023.

International Search Report in PCT/CN2023/111946 dated Oct. 2, 2023.

Search Report from SIPO in 202210657450.2 dated Nov. 23, 2022.

Search Report from SIPO in 202210657450.2 dated Feb. 24, 2023.

Notification to Grant Patent Right for Invention from SIPO 202210657450.2 dated Mar. 20, 2023.

Written Opinion of the International Searching Authority in PCT/CN2023/111946 dated Oct. 2, 2023.

* cited by examiner

METHOD FOR RECKONING ENVIRONMENTAL BACKGROUND WATER TEMPERATURE AND CALCULATING TEMPERATURE RISE IN TEMPERATURE RISE AREA OF NEWLY-BUILT COASTAL POWER PLANT

CROSS-REFERENCE TO RELATED APPLICATIONS

This application is a continuation of PCT/CN2023/111946, filed on Aug. 9, 2023, and claims priority of Chinese Patent Application No. 202210657450.2, filed on Jun. 10, 2022, the entire contents of which are incorporated herein by reference.

TECHNICAL FIELD

The application relates to the technical field of environmental engineering, in particular to a method for reckoning the environmental background water temperature and calculating the temperature rise in a temperature rise area of a newly-built coastal power plant.

BACKGROUND

A light water reactor nuclear power unit with an electric power of 1000 MW has about 2000 MW of heat discharged through the condenser. If all the waste hot water enters the adjacent sea area by direct cooling, a sharp rise may be caused in the water temperature in local waters. Increasing the chemical reaction rate will affect the reproduction rate of aquatic organisms and dissolved oxygen in water, resulting in the decrease of water density and viscosity, and may accelerate the sedimentation of particulate matter, affect the sedimentation rate of suspended solids in water and the ability to carry sediment, and change the water quality of natural water. Meanwhile, warm water discharge also affects benthos, algae, fish, corals and even beach creatures, changing their survival, growth and reproductive habits. The warm water discharge of coastal power plants has a certain impact on the marine ecological environment. Strengthening the monitoring of the thermal impact of warm water discharge of coastal power plants is a necessary measure to protect the coastal sea environment and maintain the normal operation of the ecosystem, in which the environmental background water temperature refers to the background value of the water temperature of the marine environment without being polluted by man-made heat sources; temperature rise mentioned in this application refers to the temperature rise in the local sea area after the cooling water of the coastal power plant is discharged into the coastal sea area in the form of warm water discharge, and the difference between the risen temperature and the environmental background water temperature is the temperature rise.

At present, the prediction of temperature rise range of warm water discharge in a newly-built coastal power plant is based on numerical calculation, and the calculation results may give the overall distribution trend of waste heat diffusion, which still plays an irreplaceable role in the prediction of warm water discharge in newly-built coastal power plants, and is also an important basis for sea area use management departments to approve the use of the sea. The principle of the model calculation equation is mature, but the calculation results of temperature rise and diffusion are different because of the different understanding of the parameters such as thermal diffusion coefficient, sea surface thermal radiation, vertical stratification and local water depth topography used in the prediction model. How to choose reasonable parameters has been puzzling the calculators.

Moreover, the conventional large-scale seawater temperature monitoring adopts the large-scale station monitoring method, which is specifically divided into the methods of single-ship large-scale station water temperature monitoring, multi-ship synchronous water temperature monitoring and fixed-point anchor water temperature monitoring. The single-ship large-scale station water temperature monitoring is to investigate the water temperature of multiple stations in turn near the water discharge port of nuclear power plant by using a survey ship, and regard the obtained water temperature data as the water temperature data at the same time, and obtain the large-scale distribution of sea water temperature through a spatial interpolation; multi-ship synchronous water temperature monitoring means that multiple survey ships simultaneously carry out continuous monitoring of water temperature at multiple stations near the water discharge port of nuclear power plant, and interpolate the obtained water temperature data to obtain the large-scale distribution of water temperature; fixed-point anchor water temperature monitoring is to interpolate the water temperature data of several fixed-point stations and get the water temperature large-scale distribution. However, the conventional large-scale seawater temperature monitoring has the following problems: although the single-ship large-scale station water temperature survey station is far more than that of the multi-ship synchronous water temperature monitoring method, the obtained water temperature values are not at the same moment due to the long survey time span, and the surface water temperature spreads with the tidal current in real time, so the water temperature values are difficult to represent the large-scale water temperature distribution at the same moment after interpolation; multi-ship synchronous water temperature monitoring and fixed-point anchor water temperature monitoring may obtain the water temperature of multiple stations at the same moment, but the measurement risk is high, the sampling density of spatial samples is small and the spatial interpolation range is limited. Therefore, the conventional large-scale water temperature monitoring has a large workload in the field, high risk in marine measurement and limited spatial interpolation range. Moreover, the water temperature obtained by large-scale seawater temperature monitoring is the absolute value of the water temperature near the water discharge port of the coastal power plant (that is, the temperature rising depth of the water discharge port+the environmental background water temperature), so the environmental background water temperature may not be directly measured, so the actual temperature rise influence range may not be obtained.

Satellite remote sensing technology has the characteristics of fast data obtaining, long time series comparison and low cost. Using satellite remote sensing technology to monitor the warm water discharge of nuclear power plants may monitor the distribution of warm water discharge in a large range, obtain the distribution characteristics of warm water discharge, and also verify the temperature rise influence range predicted by previous numerical values. However, satellite remote sensing water temperature monitoring is limited by the crossing time of the satellite, which makes it impossible to carry out all-weather water temperature remote sensing in any time period, and the time period of satellite remote sensing may be inconsistent with the typical tides. The maximum water temperature influence range may only be obtained through the long-time series inversion of a large number of remote sensing data, resulting in a heavy workload. Meanwhile, satellite remote sensing is limited by the spatial resolution of 100 meters, and it is unable to identify the details of temperature and water distribution in a small area. Moreover, clouds and mixed pixels of land and water also have certain influence on remote sensing monitoring of warm water discharge. However, the environmental background water temperature determined by satellite remote sensing may come from the results of the previous temperature rise mathematical model. Because of the uncertainty of numerical calculation, the selection of environmental background water temperature value is controversial, which leads to the accuracy of temperature rise range inversion.

Aircraft aerial photography remote sensing of water temperature has the advantages of high resolution (up to 0.1° C.), free aerial photography time and high positioning accuracy. Generally, unmanned aerial vehicle and manned aircraft are used. Thermal infrared imager based on unmanned aerial vehicle may conveniently and quickly realize the inversion of water temperature near the water discharge port of coastal power plant, and may identify the details of warm water discharge distribution in detail, making up for the shortcomings of long period and low resolution of satellite remote sensing images. Manned aircraft may be equipped with sensors with higher accuracy, and the aircraft speed is faster, so that aerial photography of a large area of sea area may be realized. The monitoring of warm water discharge in coastal power plants based on unmanned aerial vehicles (UAVs) equipped with thermal infrared sensors is still limited by such factors as the small width of thermal infrared imaging and the difficulty of image matching in all waters. Although manned aircraft may solve some of the above shortcomings, the cost of a single aerial photography is too high, and if aerial photography and inversion are carried out in typical seasons and typical tides, it will be an expensive expenditure. Moreover, the inversion of environmental background water temperature is still the shortcoming of aircraft aerial photography inversion, which may not distinguish the environmental background water temperature.

SUMMARY

In order to overcome the defects of the prior art, the technical problem to be solved by the application is to provide a method for reckoning the environmental background water temperature and calculating the temperature rise in a temperature rise area of a newly-built coastal power plant, which solves the problem that the environmental background water temperature and the real temperature rise are difficult to obtain after the temperature rise cooling water is discharged, and the investigation requires less manpower and material resources, is not restricted by meteorological factors, and the water temperature obtained by observation has high accuracy and reliability.

In order to achieve the objectives, the application adopts the following technical scheme.

The method for reckoning environmental background water temperatures in a temperature rise area of a newly-built coastal power plant, including following steps:

S01, before an operation of the newly-built coastal power plant, selecting at least one position similar to background characteristics of a hydrological environment of a discharge port on a shore or in a sea at a sea area near the discharge port to build a water temperature reference station; calculating a maximum temperature rise envelope of a warm water discharge through a temperature rise mathematical model, and selecting sites within a maximum temperature rise envelope range of the warm water discharge to build a plurality of other water temperature observation stations;

S02, carrying out a long-term synchronous continuous observation of the sea surface water temperatures of the water temperature reference station and the other water temperature observation stations, and recording the environmental background water temperatures of the water temperature reference station and a plurality of the other water temperature observation stations;

S03, analyzing the water temperature data obtained in the S02, and building the long-term linear relationship of the environmental background water temperatures between the water temperature reference station and each of the other water temperature observation stations; and S04, after the operation of the newly-built coastal power plant, continuously observe the water temperatures of the water temperature reference station, and reckoning and obtaining the environmental background water temperatures of each of the other water temperature observation stations according to the water temperature of the water temperature reference station through the linear relationship obtained in the S03.

The preferred technical scheme of the application is that the method further includes a step of obtaining an environmental background water temperature field distribution by carrying out an interpolation in a small range on obtained environmental background water temperatures of a plurality of the other water temperature observation stations.

The preferred technical scheme of the application is that the distance between the water temperature reference station and the discharge port is no more than 20 kilometers, and there is no influence of other cold and heat sources; the water temperature reference station is located in the sea area outside the temperature rise range of 0.5° C. calculated by temperature rise mathematical model, preferably outside the sea area with temperature rise of 0.1° C.

The preferred technical scheme of the application is that a temperature rise envelope of 1-4° C. is obtained according to the maximum temperature rise envelope calculated by the temperature rise mathematical model in the S01, and at least two positions suitable for building the other water temperature observation stations are selected on each temperature envelope. The preferred technical scheme of the application is that the S02 also includes a correlation analysis of the observed values of the water temperatures of the water temperature reference station and the other water temperature observation stations for one month: if the correlation coefficient between the values of water temperatures of the other water temperature observation stations and the values of water temperatures of the water temperature reference station is above 0.85, the other water temperature observation stations with a reliability of over 95% are kept and observed continuously, and the correlation coefficient below 0.85 are stopped or relocated; if the correlation coefficient between the water temperature reference station and more than 50% of the other water temperature observation stations is lower than 0.85, the water temperature reference station is abandoned or relocated.

The preferred technical scheme of the application is that when a number of the water temperature reference stations is greater than or equal to 2, linear relationships of the water temperature reference stations and the other water temperature observation stations are built respectively, and verification analyses are carried out one by one, and the water temperature data of the water temperature reference station with the best linear relationship fitting relationship and the smallest mean square error is selected as basis for calculating the background water temperatures of the other water temperature observation stations.

The preferred technical scheme of the application is that the method also includes a step of carrying out a continuous observation and carrying out a linear relationship coefficient correction before the operation of the newly-built coastal power plant.

The application also includes method for calculating a temperature rise in a temperature rise area of a newly-built coastal power plant, including following steps:

S01, reckoning an environmental background water temperature of a plurality of other water temperature observation stations after an operation of a coastal power plant by using the above method for reckoning environmental background water temperatures in the temperature rise area of the newly-built coastal power plant;

S02, after the operation of the coastal power plant, measuring an on-site absolute water temperatures at positions of the other water temperature observation stations;

S03, a difference value between an on-site absolute water temperature of the other water temperature observation station and a reckoned environmental background water temperature is an actual temperature rise of the other water temperature observation station; and S04, reckoning and obtaining the environmental background water temperatures of other water temperature observation stations, and carrying out an interpolation in a small range to obtain the environmental background water temperature distribution in the water discharge port area.

The preferred technical scheme of the application is that the method further includes the step of obtaining the environmental background water temperature field distribution by interpolating the obtained environmental background water temperatures of a plurality of other water temperature observation stations in a small range, and obtaining the temperature rise field distribution near the water discharge port by combining the absolute water temperature distribution obtained by satellite and/or aviation remote sensing.

The application has the following beneficial effects.

First, the environmental background water temperatures of a plurality of points near the water discharge port may be calculated synchronously and in real time through the observed values of the water temperatures of the water temperature reference station, which is not affected by the disturbance of the warm water discharge on the environmental background water temperatures, thus solving the problem that the environmental background water temperatures are not easy to obtain after the temperature rise cooling water is discharged;

Second, compared with the traditional multi-frequency water temperature large-scale station observation method, the investigation requires less manpower and material resources. After building the linear relationship between the water temperature reference station and other water temperature observation stations, only the water temperature reference station is kept for continuous observation, and the environmental background water temperatures of other water temperature observation stations may be calculated:

Third, compared with satellite remote sensing and aircraft remote sensing, the method is not restricted by meteorological factors, and the input of manpower and material resources in the early observation is less, and the accuracy and reliability of the water temperature obtained by observation are high. After building the reckoning relationship between the water temperature reference station and other water temperature observation stations, the water temperatures may be combined with the absolute water temperature distribution near the water discharge port obtained by satellite and aircraft remote sensing to obtain the actual temperature rise field distribution.

DETAILED DESCRIPTION OF THE EMBODIMENTS

Figure 1:
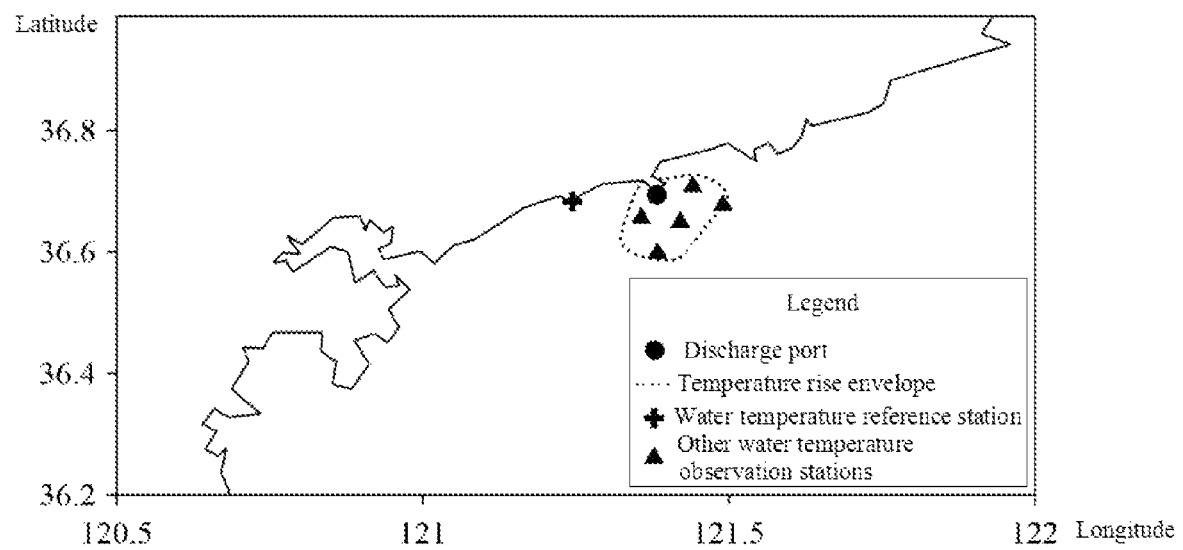
FIG. 1 is a schematic diagram of the positions of a water temperature reference station and other water temperature observation stations provided in the specific embodiment of the present application.

The technical scheme of the present application will be further explained by specific embodiments with the attached drawings.

First: Principle Introduction

The seawater temperature equation may be expressed as follows:

$$\frac{\partial u}{\partial x} + \frac{\partial v}{\partial y} + \frac{\partial w}{\partial z} = 0$$

$$\frac{\partial T}{\partial t} + u\frac{\partial T}{\partial x} + v\frac{\partial T}{\partial y} + w\frac{\partial T}{\partial z} = \frac{\partial}{\partial z}\left(K_h \frac{\partial T}{\partial z}\right) + F_T$$

where u, v and w represent the sea current velocity components in x, y and z directions respectively: T is the seawater temperature: $K_h$ is the thermal vertical vortex viscosity coefficient; $F_T$ represents heat diffusion term or heat source term.

At the sea surface, z=ζ(x,y,t).

$$\frac{\partial T}{\partial z} = \frac{1}{\rho C_p K_h}[Q_n(x, y, z) - SW(x, y, \zeta, z)]$$

where ζ is the fluctuation of sea surface water level, and $Q_n(x,y,t)$ is the net heat flux of sea surface, including net downward long-wave radiation, net downward short-wave radiation, latent heat and sensible heat flux; SW(x,y,ζ,t) is short-wave radiation of the sea surface; $C_p$ is the specific heat of seawater, long-wave radiation, sensible heat flux and latent heat flux usually occur on the sea surface.

It can be seen that the sea surface water temperature is closely related to heat flux and sea current without the influence of heat source term. In an open sea area or a semi-closed bay, the sea surface heat fluxes of two points A and B (generally within 20 kilometers) which are not far apart are basically the same. If the hydrological environment of the two points is basically the same (sea current distribution characteristics and water depth topography), the water temperatures of points A and B will show a significant linear relationship without the influence of runoff and other cold and heat sources, such as B=AX+C (X and C are related coefficients).

According to the seawater temperature equation, when one of points A or B is affected by heat source, the linear relationship between points A and B will be broken. Assuming that point B is affected by heat source, point A is not affected, and at this time, the previously linear relationship of water temperature between point A and point B, B=AX+C, will not be built, because after the temperature of point B is affected by additional superimposed heat source, the water temperature of point B=environmental background water temperature of point B+temperature rise or temperature drop of point B, that is, B=AX+C+D, and D is temperature rise. Therefore, when the heat source affects point B and point A is not affected by the heat source, the temperature rise or temperature drop may not be directly obtained by the on-site water temperature observation at point B. The environmental background water temperature at point B may be obtained through the water temperature at point A and the linear relationship B=AX+C between point A and point B, and through the on-site absolute water temperature observation at point B (environmental background water temperature+temperature rise), it can be known that the temperature rise value at point B (that is, D)=the on-site absolute water temperature observation value at point B-environmental background water temperature at point B(B=AX+C), so the temperature rise at point B caused by the influence of heat source may be obtained. Therefore, if the water temperature of point A and point B is observed in advance before any point A or B is affected by the heat source, and the linear relationship between them may be obtained, the environmental background water temperature of the affected point may be calculated through the linear relationship between them, which is beneficial to obtain the temperature rise value of the water temperature.

Second: Specific Implementation Process

Figure 2:
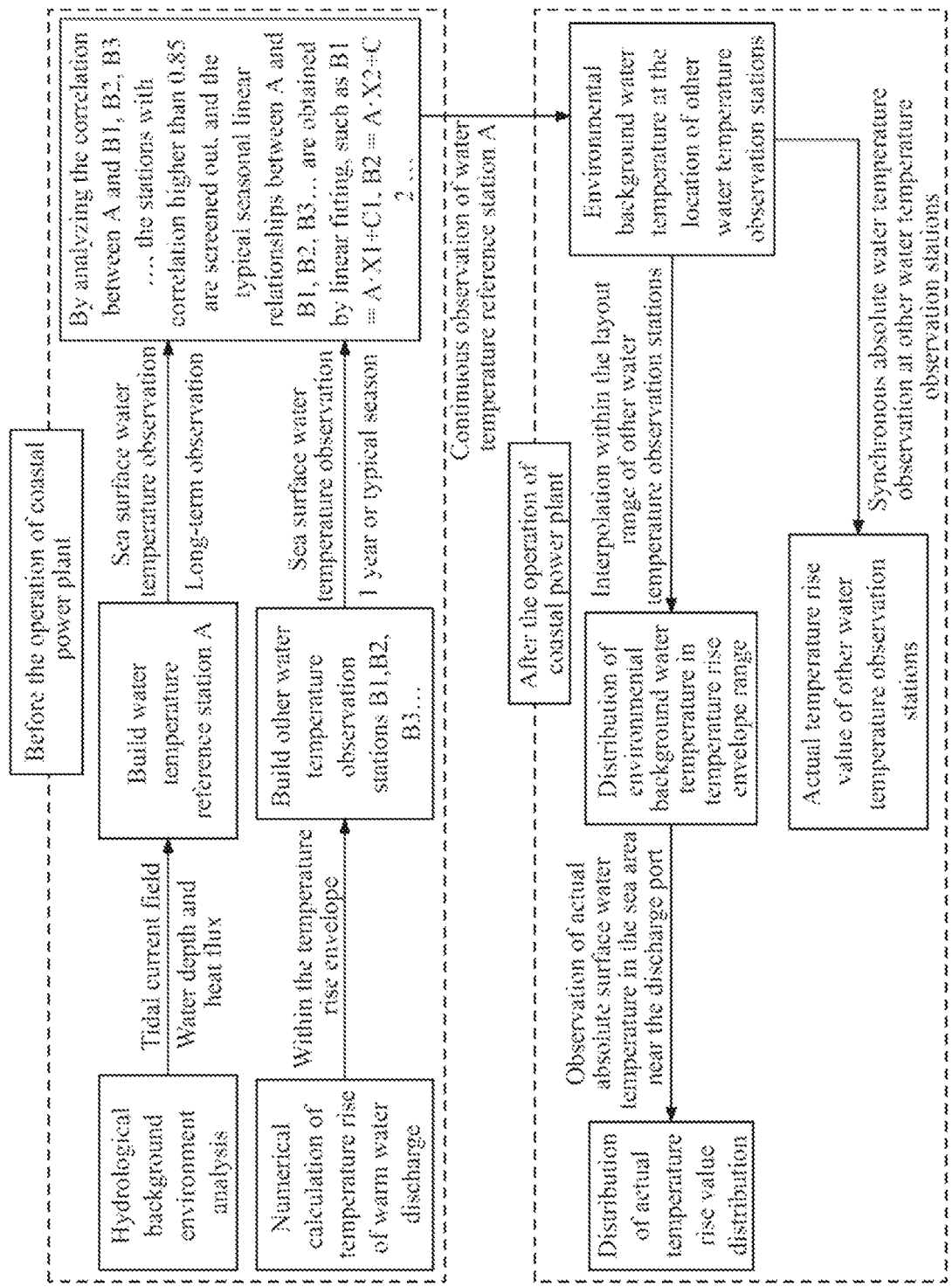
FIG. 2 is a flowchart of the actual temperature rise observation and calculation of the warm water discharge of the newly-built coastal power plant provided in the specific embodiment of the present application.

As shown in FIG. 1 and FIG. 2, a method for reckoning the environmental background water temperature and calculating the temperature rise in a temperature rise area of a newly-built coastal power plant provided by the application is as follows:

First of all, in order to master the characteristics of sea current in the sea area near the discharge port of coastal power plant, statistical analysis may be made based on the historical hydrological investigation data of the discharge port of coastal power plant, and also build a numerical calculation model of sea current to comprehensively analyze the distribution and seasonal variation characteristics of sea current in this area. If there is a lack of targeted historical data of hydrological investigation, supplementary investigation of hydrological environment may be carried out. The principle of station layout is to cover the sea area near the discharge port and the sea area near the water temperature reference station to be selected, which may represent the sea current distribution characteristics of the above sea areas. On the basis of numerical calculation of tidal current field or statistical analysis of historical observation data of sea current, the characteristics of sea current and residual current at the discharge port and the water temperature reference station to be selected are analyzed, and 1-3 water temperature reference stations with similar sea current characteristics in the sea area near the discharge port are screened out.

When building a water temperature reference station, based on the water temperature reference station initially selected, after on-the-spot investigation on shore or at sea, the factors such as equipment safety, station building conditions, equipment recovery, etc. may be comprehensively considered, and the meteorological conditions (sunshine, wind speed, wind direction, etc.) may be considered to be similar to the sea environment around the water discharge port. The water temperature reference station may also be ensured not to be affected by other heat sources during the operation of the coastal power plant, and the station with the best conditions for building a water temperature reference station may be selected. The observation device may be a bathythermograph or a thermometer, the sampling frequency may be 1 Hz, and the probe of the device is recommended to be 0.5 meter away from the sea surface to obtain the sea surface water temperature value A of the water temperature reference station. There is no deadline for observation at the water temperature reference station. If the water temperature reference station has good correlation with other water temperature observation stations and the site is stable, the water temperature reference station will be observed for a long time. It is suggested that two water temperature reference stations may be selected for the initial observation, and the station with the best correlation may be selected as the water temperature reference station for long-term observation in the later correlation analysis.

When building other water temperature observation stations, according to the maximum temperature rise envelope calculated by temperature rise mathematical model and the present situation of sea area development and utilization, the positions suitable for building other water temperature observation stations are selected on the temperature rise envelopes of 1° C., 2° C., 3° C. and 4° C. Each temperature envelope may select 23 observation stations to carry out water temperature observation in typical seasons (typical seasons are July, August and September in summer and December, January and February in winter). In addition, three or more observation stations may be built between the temperature rise of 1° C. and the temperature rise of 0.5° C. given by mathematical model. The observation device may be a bathythermograph or a thermometer, and the sampling frequency is not higher than 1 Hz. The probe of the device is recommended to be 0.5 meter away from the sea surface to obtain the sea surface water temperature value B of other water temperature observation stations (the water temperature values of several other water temperature observation stations are called B1, B2, B3 . . . ).

The station of water temperature reference station is no more than 20 kilometers away from the discharge port of the proposed coastal power plant. The characteristics of water depth, sea current and sea surface heat flux are similar to those of the sea area near the proposed warm water discharge port, not affected by cold and heat sources. In the next 10 years, the coastline near the water temperature reference station will not be greatly artificially changed, and its observation position is suitable for long-term observation.

Other water temperature observation stations are arranged in the maximum temperature rise envelope of 1° C., 2° C., 3° C. and 4° C. given by the mathematical model, and at least 2 stations are arranged in each temperature rise envelope. The water discharge port is located in sensitive sea area, and the number of stations may be increased according to the site conditions.

According to the observed values of the water temperatures of the water temperature reference station and other water temperature observation stations in a typical season (usually winter or summer) for one month, the correlation analyses of the water temperature values of the water temperature reference station and other water temperature observation stations are carried out. The other water temperature observation stations with correlation coefficients above 0.85 and reliability above 95% are kept and continued to be observed, and the other water temperature observation stations with correlation coefficients below 0.85 are stopped or relocated. If the water temperature correlation coefficient between the water temperature reference station and more than 50% other water temperature observation stations is lower than 0.85, the water temperature reference station will be abandoned or relocated.

According to the water temperature A obtained by the water temperature reference station in typical seasons and the water temperatures B1, B2, B3 . . . obtained by other water temperature observation stations, the typical seasonal linear relationships between the water temperature reference station and other water temperature observation stations are fitted, such as $B1=AX1+b1$, $B2=AX2+b2$, $B3=AX3+b3$, etc. (X1, X2, X3 . . . , b1, b2, b3 . . . are the correlation coefficients). If there are multiple water temperature reference stations A1, A2, etc., the typical seasonal linear relationship between each water temperature reference station and other water temperature observation stations may be fitted respectively, such as $B1=A1X1+b1$, $B1=A2X2+b2$, $B2=A1X3+b3$, $B2=A2X4+b4$, etc.

When observation conditions permit, other water temperature observation stations may observe the operation of the coastal power plant all the time before stopping observation, so as to obtain a longer time series of environmental background water temperature observation data, which may respectively fit the typical seasonal linear relationship between the water temperature reference station and other water temperature observation stations, which is more representative and applicable. If there is more than one water temperature reference station, the station with the best linear fitting and the smallest mean square error may be selected as the only water temperature reference station through verification and analysis one by one, or the water temperature reference stations corresponding to other water temperature observation stations may be selected according to the fitting degree and mean square error of the linear relationship between each water temperature reference station and other water temperature observation stations (that is, the water temperature reference station A1 has the best linear relationship with other water temperature observation stations B1 and B2, and the water temperature reference station A2 has the best linear relationship with other water temperature observation stations B3 and B4).

After the operation of coastal power plant, the water temperature reference station will be used as the benchmark to reckon the water temperature of other water temperature observation stations, and the observation will continue, and other water temperature observation stations may stop the observation. Through the real-time water temperature data observed by the water temperature reference station, combined with the typical seasonal correlation coefficient between the water temperature reference station and other water temperature observation stations calculated above, the synchronous real-time environmental background water temperature of other water temperature observation stations may be calculated. According to the reckoned results of environmental background water temperature of several other water temperature observation stations, interpolation may be carried out within the temperature rise range of 1° C. or 0.5° C. given by the mathematical model or in the sea area where other water temperature observation stations are located, and the environmental background water temperature distribution in other water temperature observation stations may be obtained.

After the operation of coastal power plant, the water discharge port will discharge cooling water with a water temperature higher than the environmental background water temperature, which will lead to the increase of water temperature in the adjacent sea area. In order to know the water temperature distribution in the sea area near the water discharge port of coastal power plant after operation, the following methods may be used to investigate the water temperature in the sea area near the water discharge port of coastal power plant: single-point anchor observation water temperature observation method (the station is the same as other water temperature observation stations), large-scale station water temperature observation method (the position of other water temperature observation stations may be covered, and the real-time position, water temperature and time information may be recorded), aircraft remote sensing or satellite remote sensing (the sea surface water temperature of other water temperature observation stations should be reversed).

The calculation method is as follows:

1. Temperature rise calculation of other water temperature observation stations: based on the synchronous water temperature observed value of the water temperature reference station and the typical seasonal correlation between the water temperature reference station and other water temperature observation stations calculated in the early stage, the environmental background water temperatures of other water temperature observation stations are reckoned, and the difference between the actual water temperature observed value of other water temperature observation station or the absolute water temperature value retrieved by remote sensing and the reckoned environmental background water temperature is the temperature rise value caused by warm water discharge at this point.

2. Calculation of temperature rise field distribution in the sea area near the water discharge port: based on the synchronous water temperature observed value of water temperature reference station and the typical seasonal correlation between water temperature reference station and other water temperature observation stations calculated in the previous period, the environmental background water temperature of other water temperature observation stations is reckoned, and the environmental background water temperature field distribution in the sea area near the water discharge port may be approximately obtained by the interpolation in a small range in the area arranged by other water temperature observation stations. The actual temperature rise field distribution is the difference between the actual water temperature distribution obtained by large-scale station water temperature survey or remote sensing and the environmental background water temperature distribution obtained by the interpolation.

3. This method is also applicable to the reckoning of the environmental background water temperature discharged by marine cold sources, such as the calculation of the environmental background water temperature of the cold water discharged from the coastal LNG receiving station.

(1) Specific Embodiment of Environmental Background Water Temperature

In 2021, a number of temporary water temperature observation stations were set up along the coast of Ningde City, Fujian Province, which were divided into three groups for water temperature correlation test, representing the open sea area and the bay sea area respectively. See Table 1 for details. The water temperature observation duration of each group is the same, and the device model for water temperature observation is RBRXR-620CTD. There are no less than two water temperature observation stations in each group. One station is selected as the water temperature reference station, and the remaining stations are used as other water temperature observation stations. The linear relationship between the two water temperatures is fitted, and the mean square deviation of the fitted water temperature is calculated to test the accuracy of the fitted water temperature.

TABLE 1

Summary of information of temporary water temperature observation stations

| Group | Station NO. | Position Longitude | Latitude | Observation duration in summer |
|---|---|---|---|---|
| First group (Open sea area) | W134 W135 | 119.794261 119.810886 | 26.501725 26.462253 | Jun. 6-Jul. 3, 2021 |
| Second group (Bay sea area) | W123 W126 W131 | 120.011108 119.901431 119.693817 | 26.771256 26.690111 26.673664 | Jun. 11th-Jul. 4th, 2021 |
| Third group (Open sea area) | W121 W122 | 120.314617 120.243806 | 26.949786 26.930319 | Jun. 6-Jul. 3, 2021 |

Figure 3:
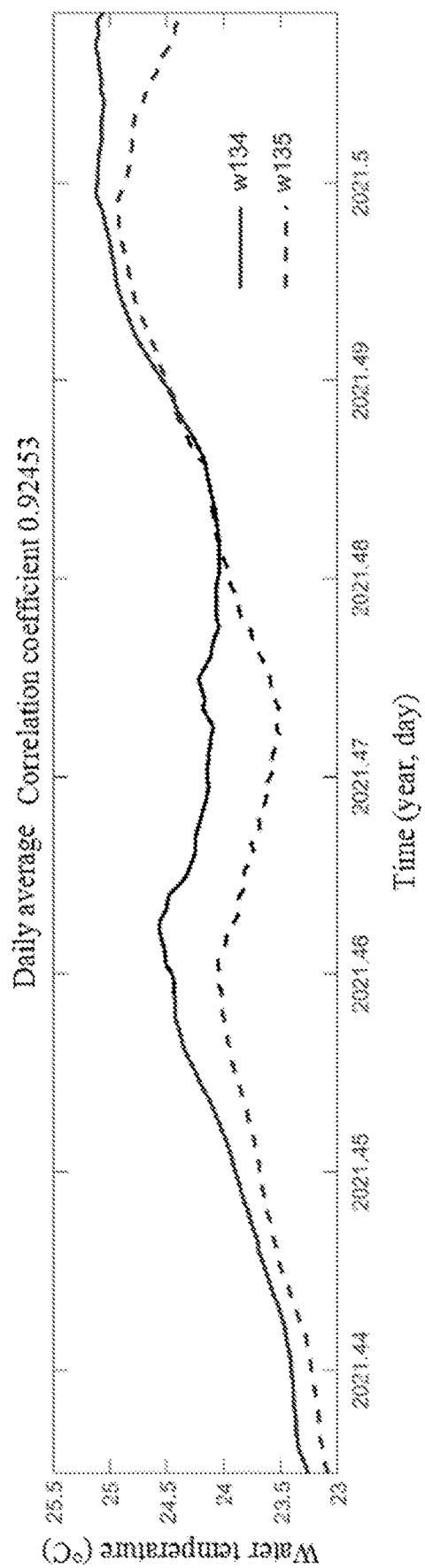
FIG. 3 is a first group of water temperature linear fitting of the daily average water temperature correlation between w134 (blue, solid line) station and w135 (red, solid line) station provided in the specific embodiment of the present application.
Figure 4:
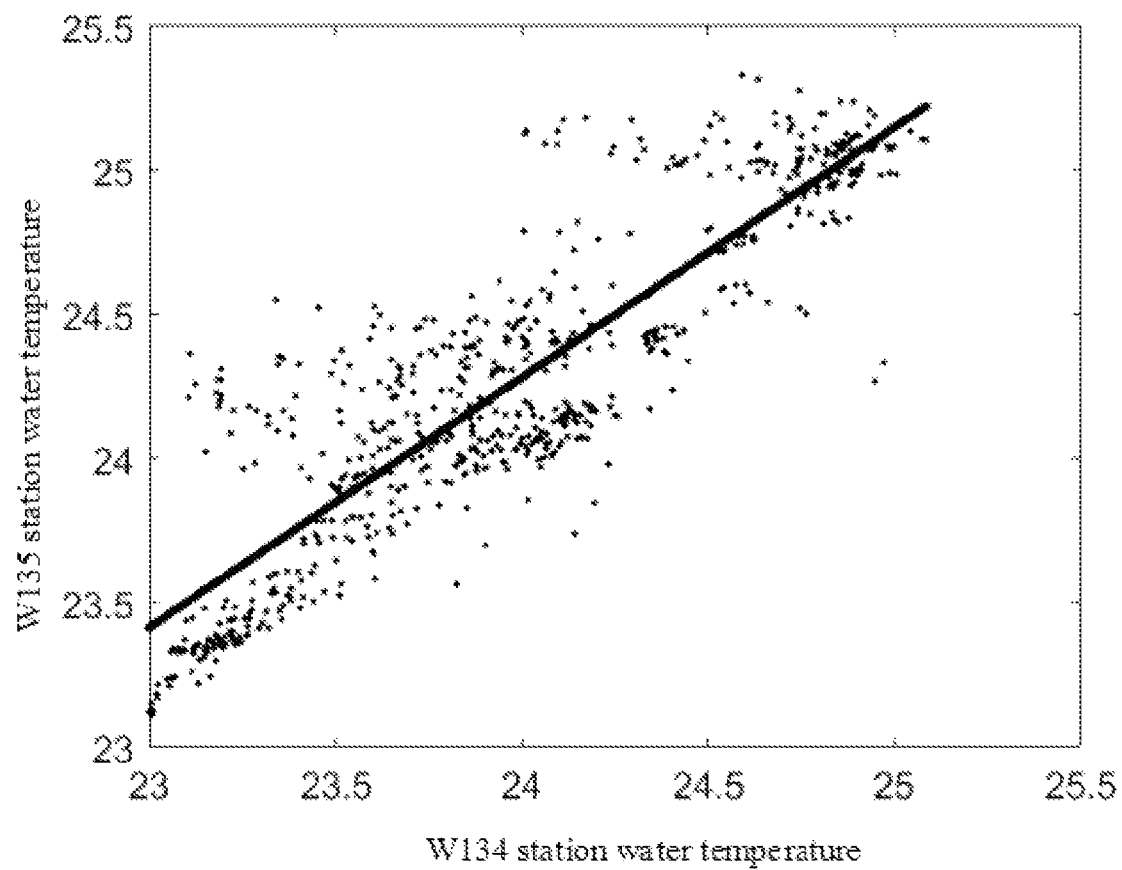
FIG. 4 is an hourly water temperature linear fitting diagram of the first group of water temperature linear fitting between w134 station and w135 station provided in the specific embodiment of the present application.

1. As shown in FIG. 3 and FIG. 4, in the first group of linear fitting of water temperature, w134 station is taken as the water temperature reference station (average water temperature is 23.978° C.) and W135 station is taken as the other water temperature observation station (average water temperature is 24.264° C.), and the daily average water temperature correlation coefficient of the two stations is 0.924, with the reliability exceeding 99%. The water temperatures of the two stations has the following linear relationship: $T_{w135}=0.867 \times T_{w134}+3.467$, and the mean square deviation is 0.069, which shows that there is a significant linear relationship between the two stations, and the water temperature of W135 station calculated by taking W134 station as the water temperature reference station is more accurate. Therefore, the formula $T_{w135}=0.867 \times T_{w134}+3.467$ and the hourly water temperature measured at W134 station may be used to reckon the hourly water temperature at W135 station in summer.

Figure 5:
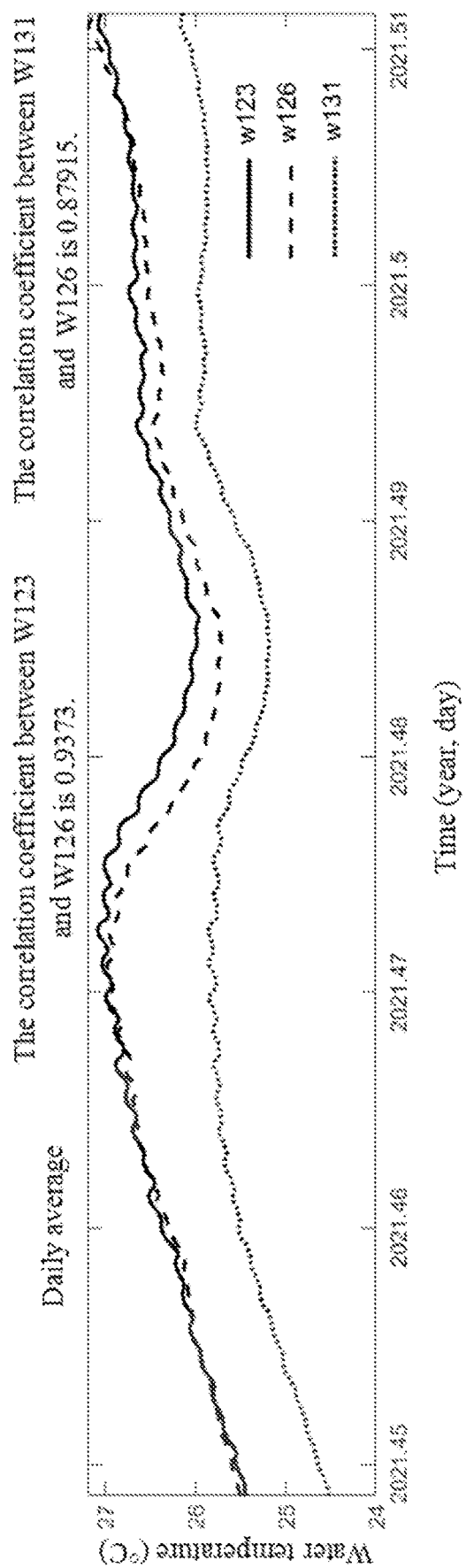
FIG. 5 is a second group of water temperature linear fitting for the daily average water temperature correlation of w123 (blue, solid line) station, w126 (red, solid line) station and w131 (green, solid line) station provided in the specific embodiment of the present application.
Figure 6:
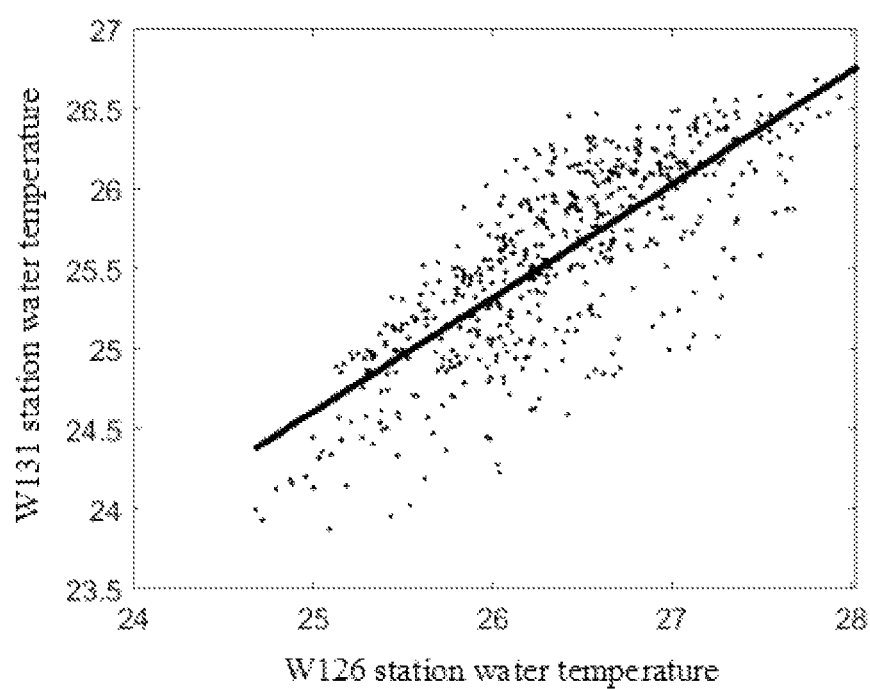
FIG. 6 is an hourly water temperature linear fitting diagram of the second group of water temperature linear fitting between w126 station and w131 station provided in the specific embodiment of the present application.
Figure 7:
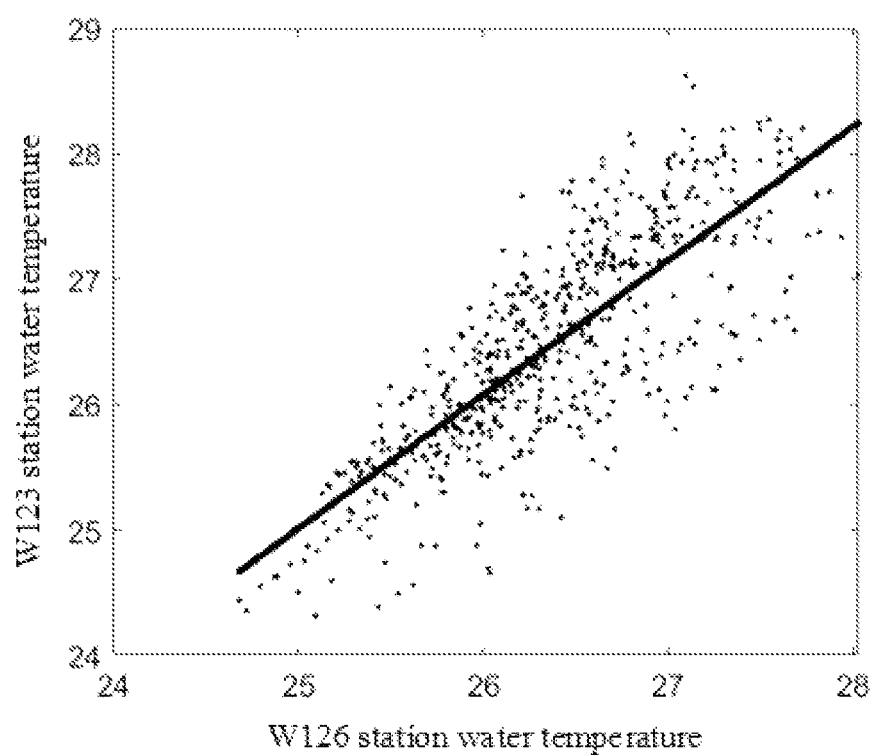
FIG. 7 is an hourly water temperature linear fitting diagram of the second group of water temperature linear fitting between w126 station and w123 station provided in the specific embodiment of the present application.
Figure 8:
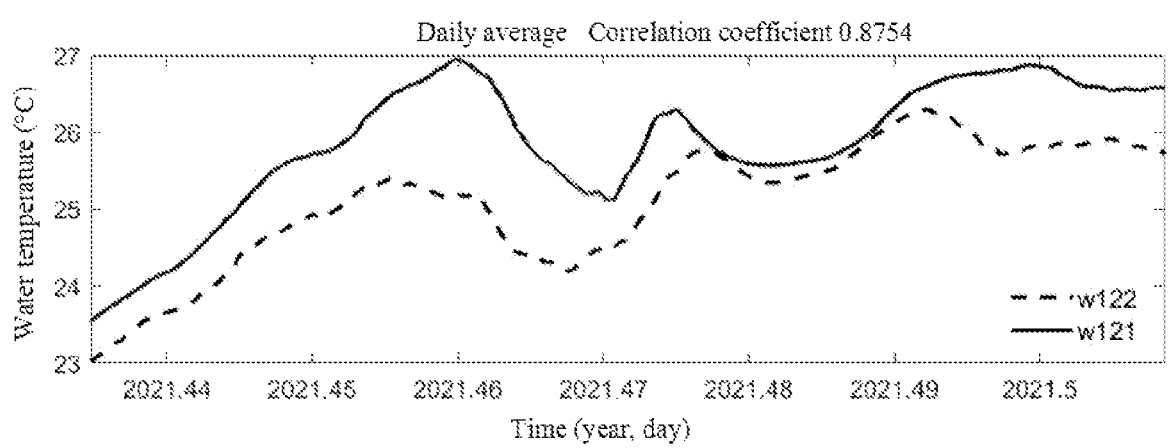
FIG. 8 is the correlation of the daily average water temperature of the third group of water temperature linear fitting w121 (red, solid line) station and w122 (blue, solid line) station provided in the specific embodiment of the present application.
Figure 9:
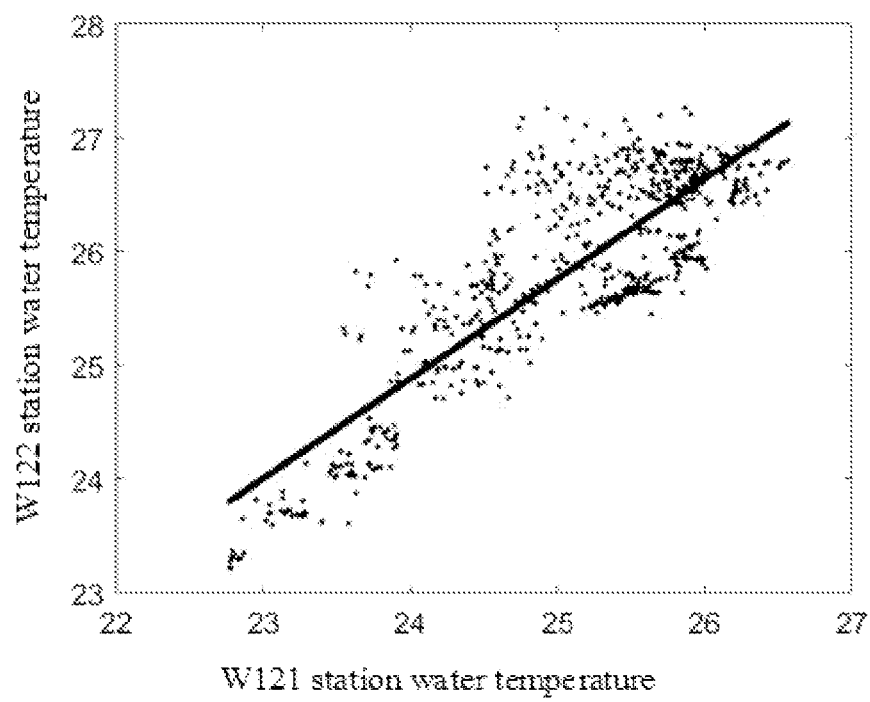
FIG. 9 is an hourly water temperature linear fitting diagram of the third group of water temperature linear fitting between w121 station and w122 station provided in the specific embodiment of the present application.

2. As shown in FIG. 5, FIG. 6 and FIG. 7, in the second group of water temperature linear fitting, W126 station is used as the water temperature reference station (average water temperature is 26.354° C.), and W123 and W131 stations are used as other water temperature observation stations (average water temperatures are 26.461° C. and 25.571° C.). Through correlation analysis, it is found that the correlation coefficient of daily average water temperature at W123 and W126 stations is 0.937, and the correlation number of daily average water temperature at W126 and W131 stations is 0.879, with reliability exceeding 99%. The hourly water temperatures at W126 and W123 and W131 stations have the following linear relationships:

$T_{w123}=0.1.069 \times T_{w126}-1.725$, $T_{w131}=0.710 \times T_{w126}+6.834$, with mean square deviations of 0.274 and 0.133, respectively. Therefore, it can be seen that there is a significant linear relationship among the three stations. Therefore, in summer, the hourly water temperature at stations W123 and W131 may be reckoned by using the formula: $T_{w123}=0.1.069 \times T_{w126}-1.725$, $T_{w131}=0.710 \times T_{w126}+6.834$;

3. As shown in FIG. 8 and FIG. 9, in the third group of water temperature linear fitting, W121 station is used as the water temperature reference station (average water temperature is 25.075° C.), and W122 station is used as other water temperature observation station (average water temperature is 25.832° C.). Through correlation analysis, the correlation coefficient of daily average water temperature at W121 and W122 stations is 0.875, and the reliability is over 99%. It is found that the hourly water temperature of the two stations has the following linear relationship: $T_{w122}=0.878 \times T_{w121}+3.802$, and the mean square error is 0.246, which shows that there is a significant linear relationship between the two stations. Therefore, the formula $T_{w122}$ $0.878 \times T_{w121}+3.802$ and the hourly water temperature measured at W121 station may be used to reckon the hourly water temperature at W122 station in summer.

From the experimental results of linear fitting of water temperature, it can be seen that there is a significant linear relationship between the water temperature reference station and other water temperature observation stations, whether in the bay or in the open sea area, when the current distribution characteristics, water depth topography characteristics and meteorological conditions of the water temperature reference station are similar to those of other water temperature observation stations, and when the distance between the water temperature reference station and other water temperature observation stations is less than 30 kilometers, and the mean square error is very small. Therefore, when the water temperature of other water temperature reference stations is affected by the heat source, the water temperature of other water temperature observation stations reckoned by the water temperature reference station may represent the environmental background water temperature of the position of other water temperature observation stations.

(2) Embodiment of Model Temperature Rise Calculation

1. Calculation Parameters

Figure 10:
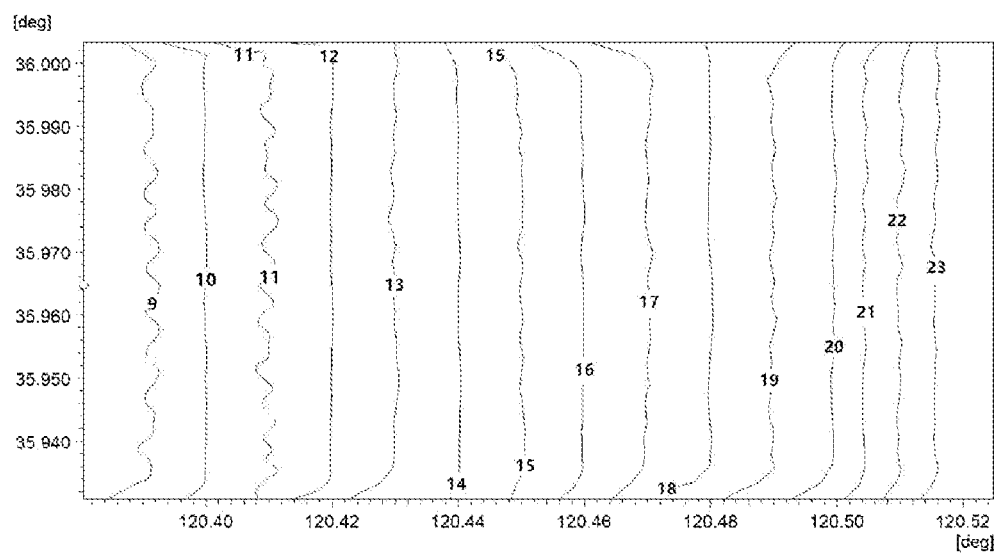
FIG. 10 is a schematic diagram of the model grid and water depth distribution of the temperature rise reckoning numerical test provided in the specific embodiment of the present application.

As shown in FIG. 10, numerical calculation is used to test the feasibility of the method proposed in this patent to obtain the temperature rise by calculating the environmental background water temperature, so a baroclinic two-dimensional power flow model is built. The model is based on MIKE21 software, and a rectangular sea area model is built. The length and width of the rectangular sea area are 14 kilometers and 9 kilometers, respectively, and the grid resolution is 35-50 meters. The water depth of the model gradually becomes deeper (−8 to −24 meters) from west to east, and the open boundary is located on the east side of the rectangular sea, which is only driven by $M_2$ tidal component. Other boundaries are land boundaries, and the water temperature gradient at the open boundary is zero. The model is a two-dimensional baroclinic model with an initial water temperature of 20° C. and an initial flow velocity of 0 cm/s. During the calculation, the air temperature is constant at 21° C., the relative humidity is constant at 88%, the wind speed is constant at 3 m/s, and the wind direction is SE. The model takes into account the long-wave radiation on the sea surface, the net downward short-wave radiation, latent heat and sensible heat flux. The warm water discharge port is located in the middle of the west boundary of the rectangular sea, with a drainage capacity of 2 m³/s and a water discharge temperature of 26° C. The calculation step of the model is 3 s, and the calculation duration is 18 days. The numerical calculation tests of two working conditions were carried out, and the simulation calculation of temperature diffusion was calculated under the conditions of non-existence and existence of warm water discharge. The warm water discharge was added on the third day after the model calculation was stable, and other calculation conditions of the two working conditions were the same.

2. Test Scheme

Figure 11:
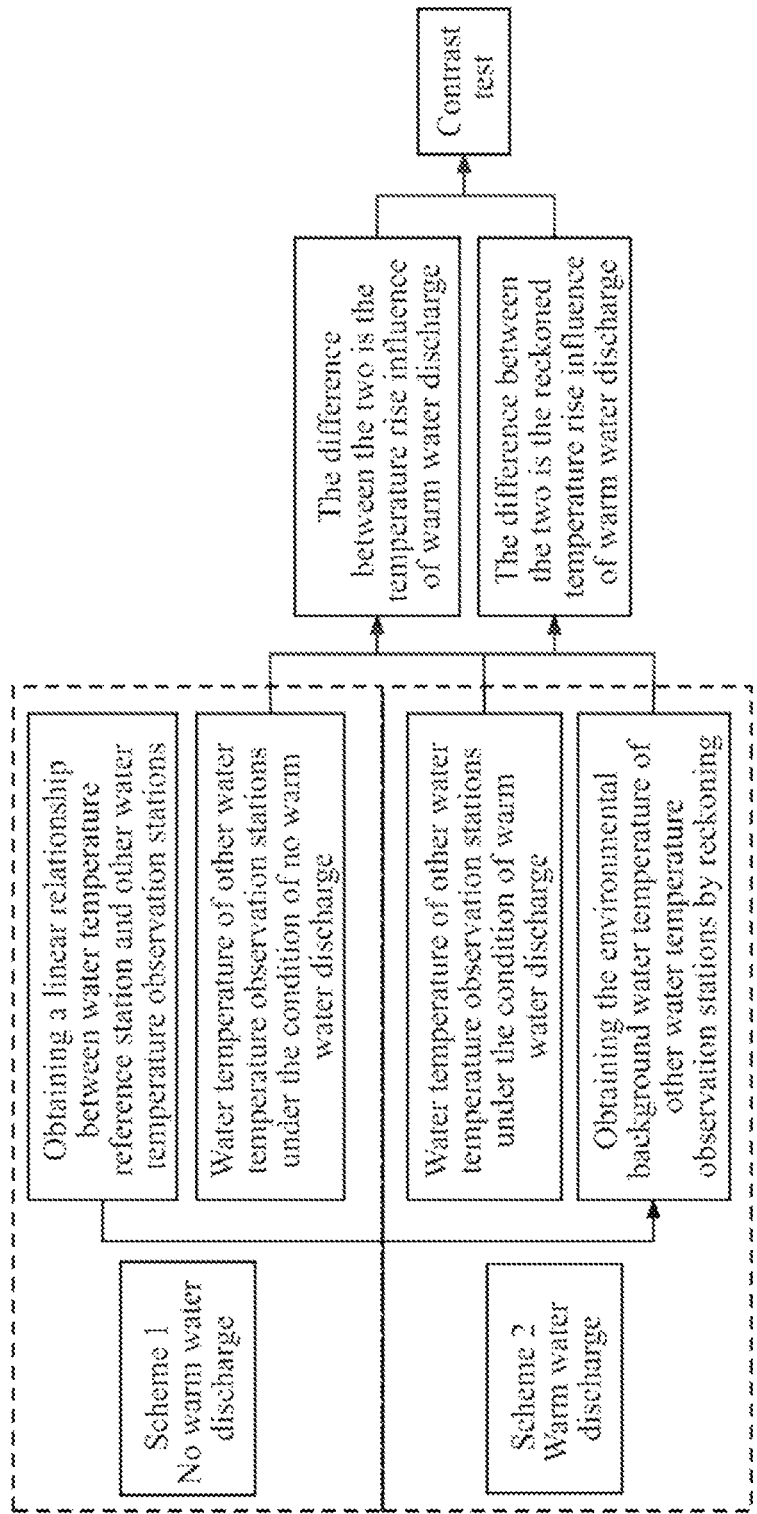
FIG. 11 is a flow chart of the numerical calculation test idea of the temperature rise reckoning numerical test provided in the specific embodiment of the present application.

Under the condition that the warm water discharge does not exist (Scheme 1), the linear relationship between the water temperature reference station and other water temperature observation stations is constructed by selecting the calculation results 15 days after the model: In the presence of warm water discharge (Scheme 2), the diffusion influence of warm water discharge is calculated through model calculation for 15 days, and the temperature rise influence of warm water discharge is obtained according to the water temperature changes of other water temperature observation stations in Scheme 1 and Scheme 2, and the environmental background water temperature of other water temperature observation stations is reckoned according to the linear relationship between the water temperature reference station and other water temperature observation stations obtained in Scheme 1, and the temperature rise may be obtained by combining the water temperatures of other water temperature observation stations in Scheme 2. Comparing the water temperature difference (temperature rise) of other water temperature observation stations in Scheme 2 and Scheme 1 with the difference (temperature rise) between other water temperature observation stations in Scheme 2 and the reckoned environmental background water temperature, the feasibility of the application may be obtained. The overall test idea is shown in FIG. 11.

3. Test Process

① Calculation Result of Scheme 1 (No Warm Water Discharge)

Figure 12:
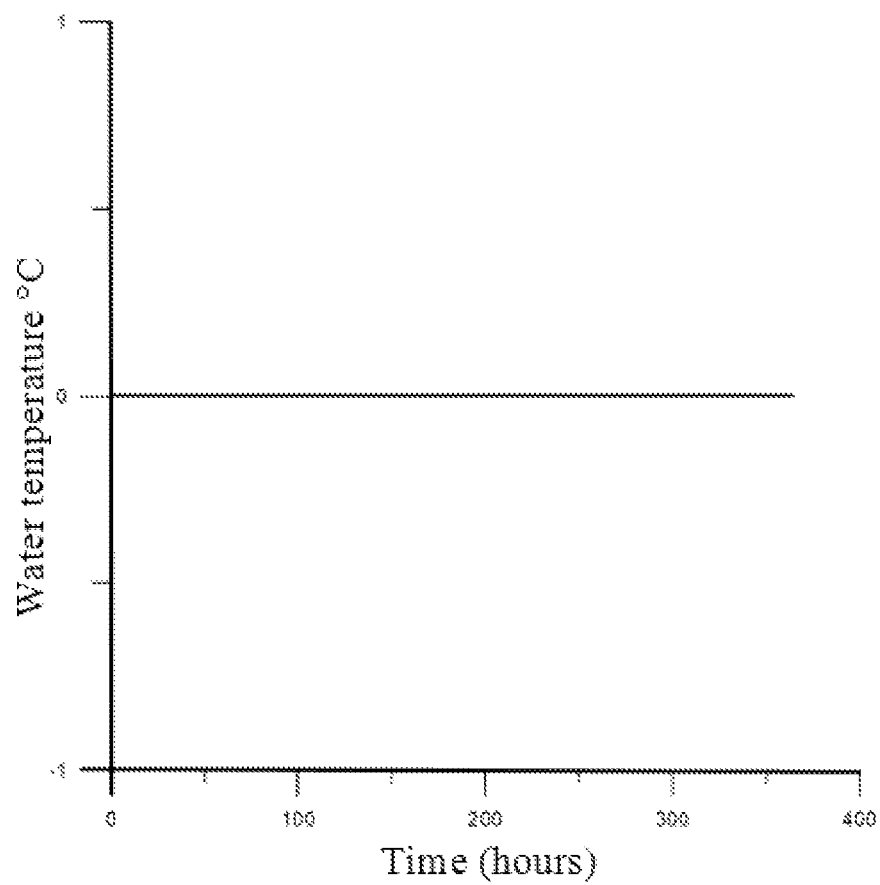
FIG. 12 is a time series diagram of water temperature at station T1, an additional scheme of temperature rise reckoning numerical test provided in the specific embodiment of the present application.
Figure 13:
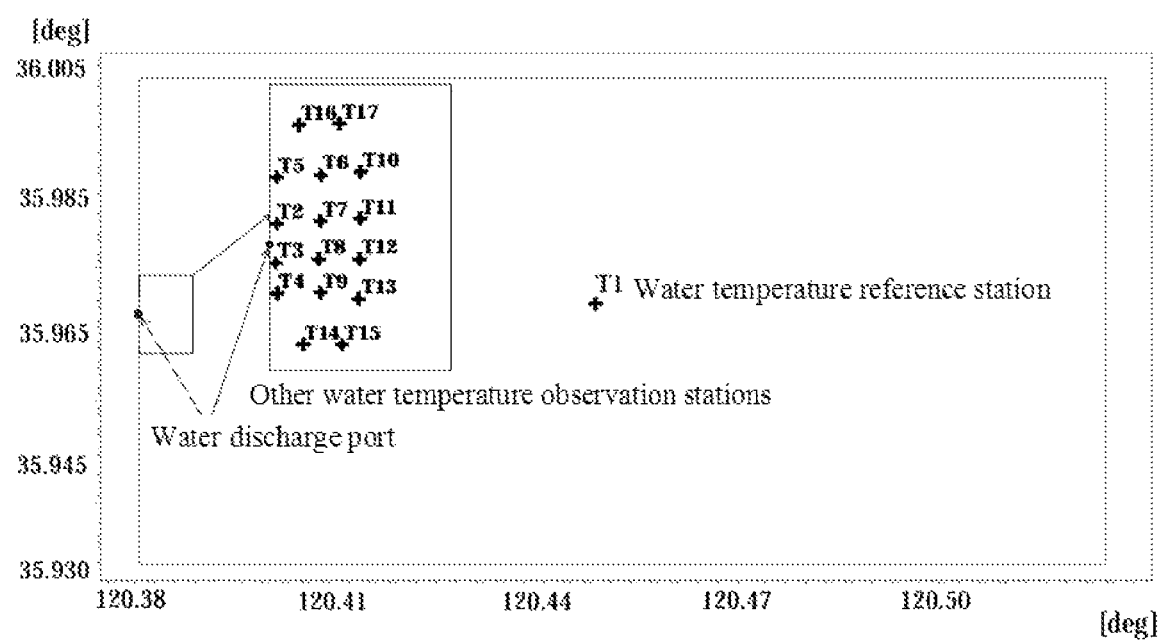
FIG. 13 is a schematic diagram showing the distribution of water temperature reference station and other water temperature observation stations in the temperature rise reckoning numerical test provided in the specific embodiment of the present application.
Figure 14A:
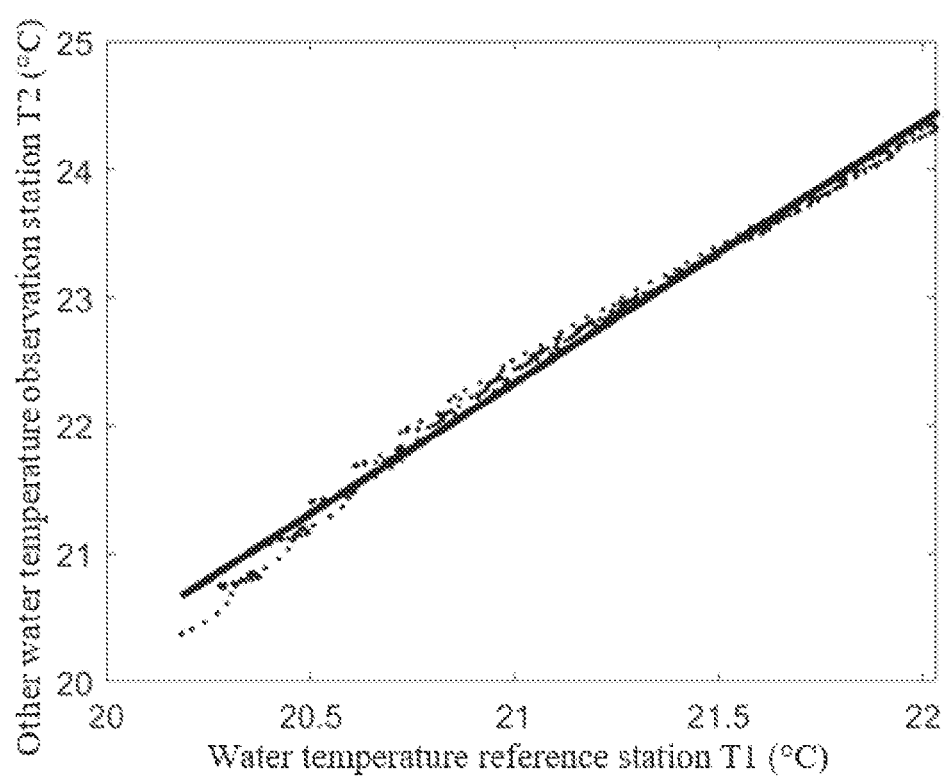
FIG. 14A is a schematic diagram of the correlation between Water temperature reference station T1 and other water temperature observation station T2 in the temperature rise reckoning numerical test provided in the specific embodiment of the present application.
Figure 14B:
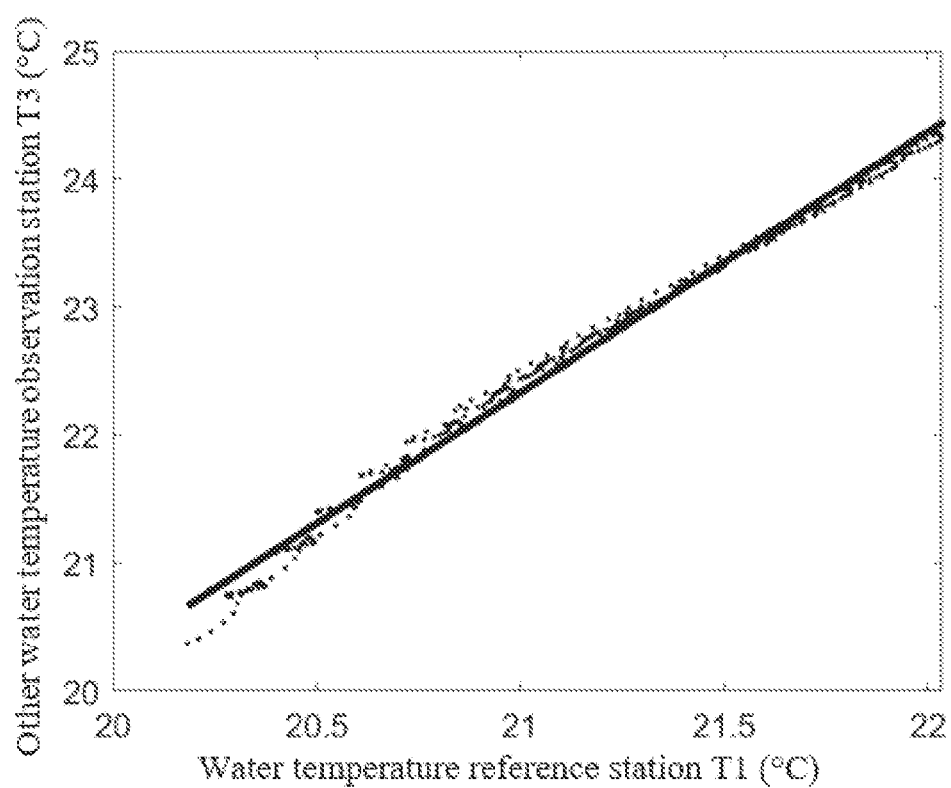
FIG. 14B is a schematic diagram of the correlation between Water temperature reference station T1 and other water temperature observation station T3 in the temperature rise reckoning numerical test provided in the specific embodiment of the present application.
Figure 14C:
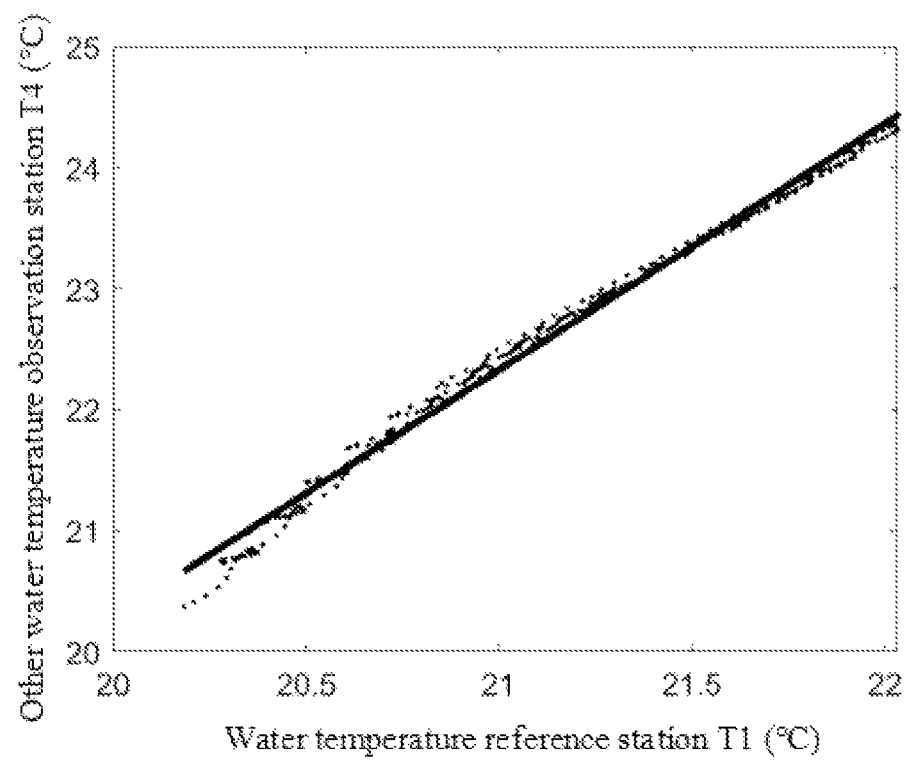
FIG. 14C is a schematic diagram of the correlation between Water temperature reference station T1 and other water temperature observation station T4 in the temperature rise reckoning numerical test provided in the specific embodiment of the present application.
Figure 14D:
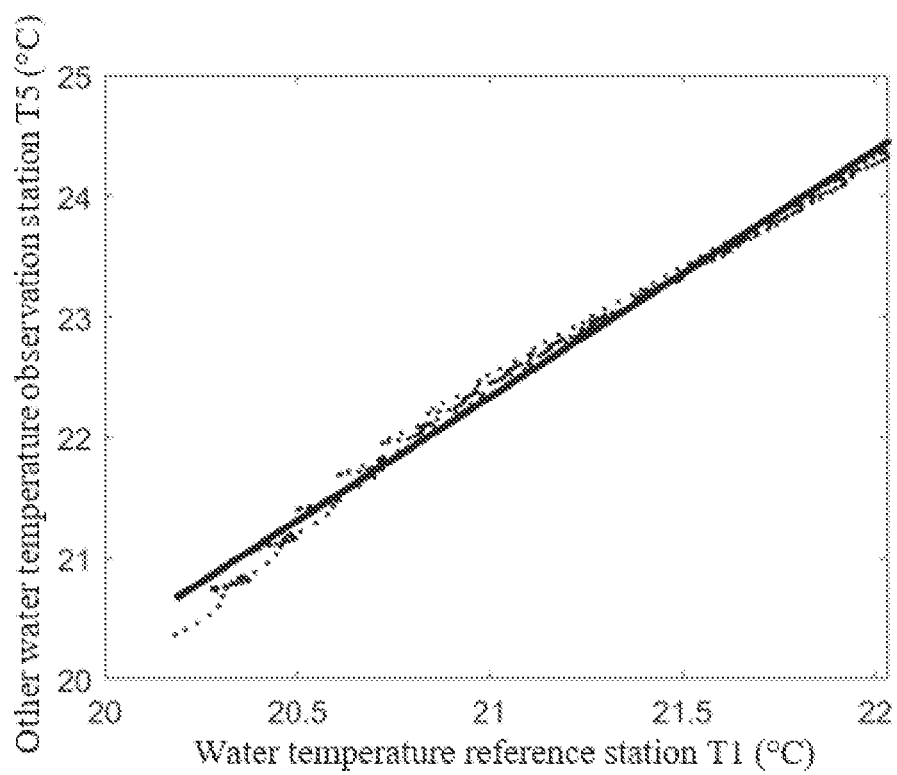
FIG. 14D is a schematic diagram of the correlation between Water temperature reference station T1 and other water temperature observation station T5 in the temperature rise reckoning numerical test provided in the specific embodiment of the present application.
Figure 14E:
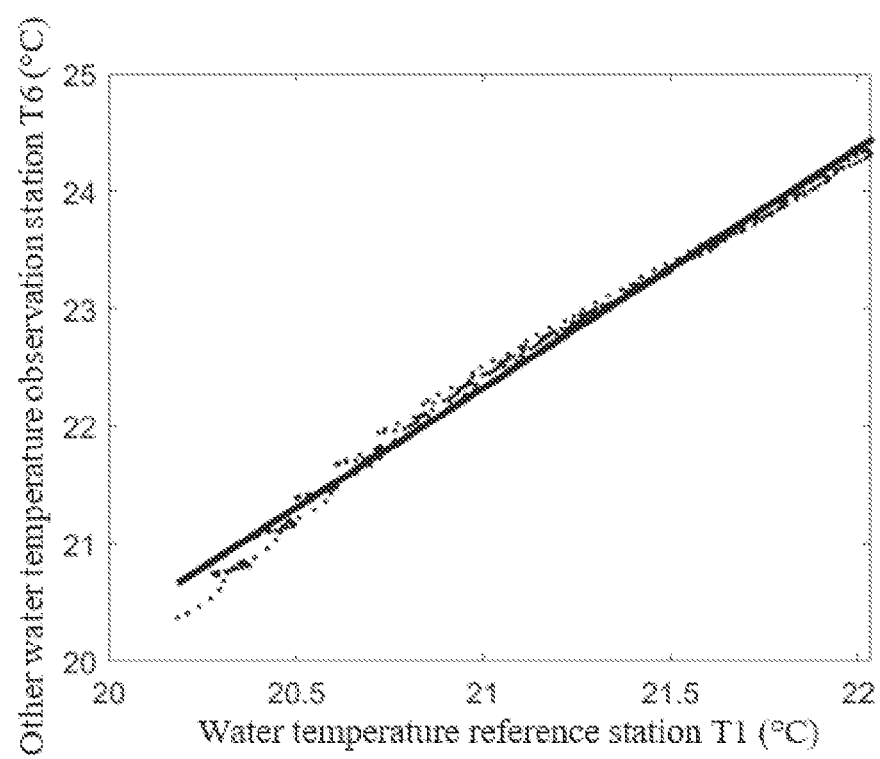
FIG. 14E is a schematic diagram of the correlation between Water temperature reference station T1 and other water temperature observation station T6 in the temperature rise reckoning numerical test provided in the specific embodiment of the present application.
Figure 14F:
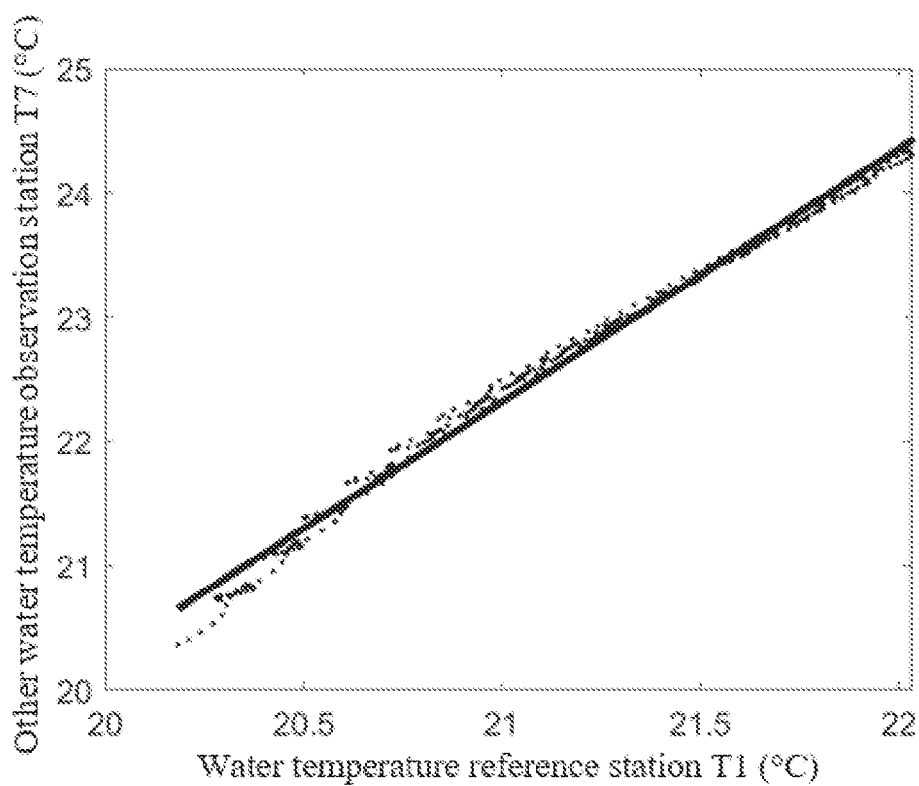
FIG. 14F is a schematic diagram of the correlation between Water temperature reference station T1 and other water temperature observation station T7 in the temperature rise reckoning numerical test provided in the specific embodiment of the present application.
Figure 15A:
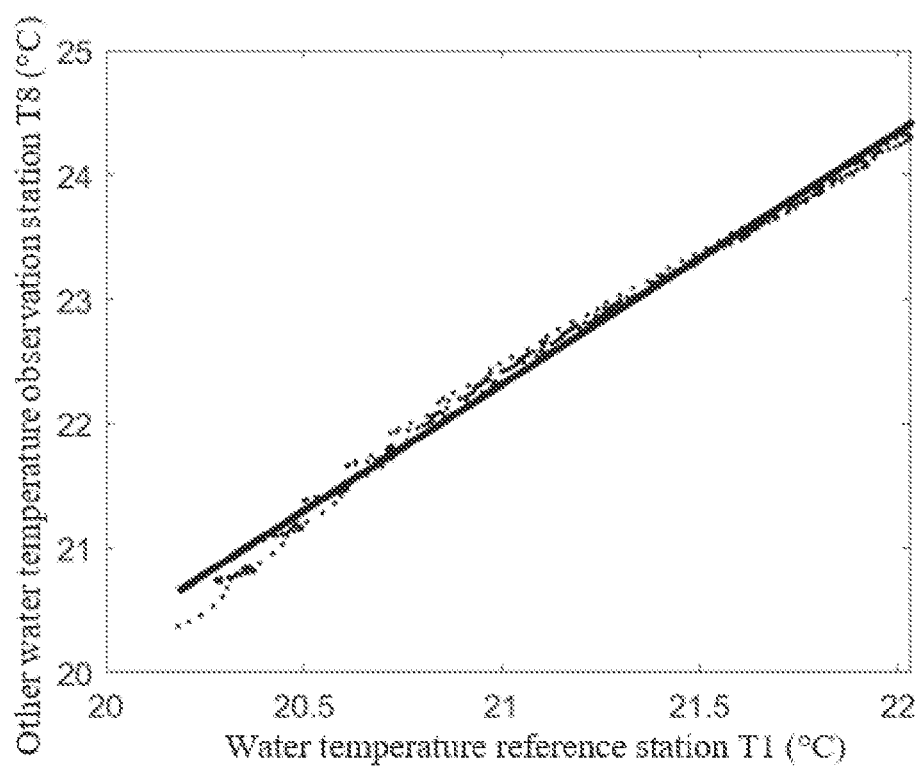
FIG. 15A is a schematic diagram of the correlation between Water temperature reference station T1 and other water temperature observation station T8 in the temperature rise reckoning numerical test provided in the specific embodiment of the present application.
Figure 15B:
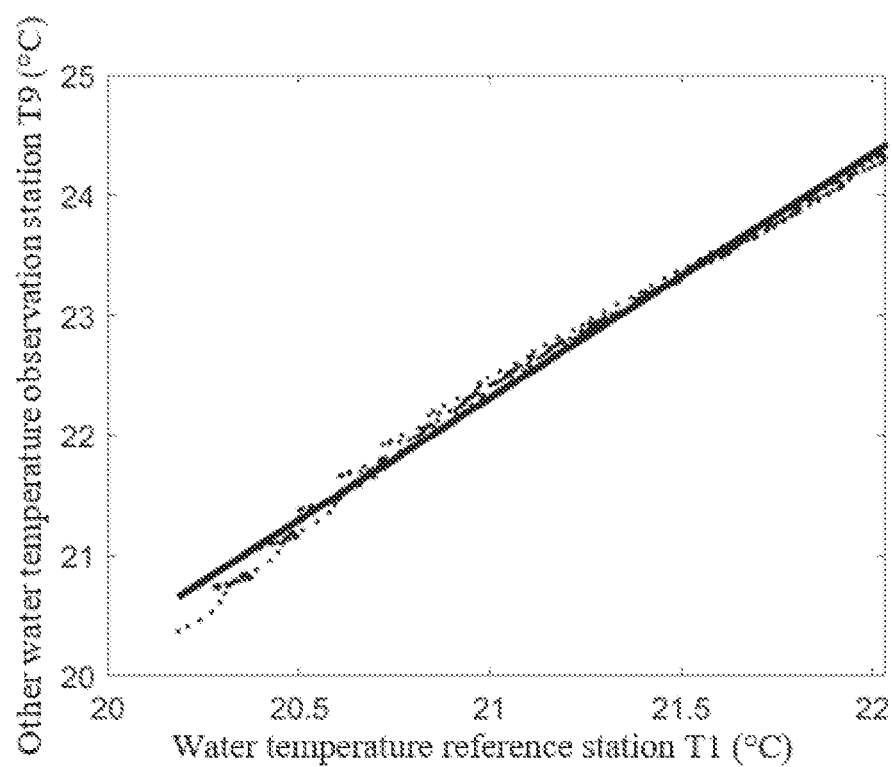
FIG. 15B is a schematic diagram of the correlation between Water temperature reference station T1 and other water temperature observation station T9 in the temperature rise reckoning numerical test provided in the specific embodiment of the present application.
Figure 15C:
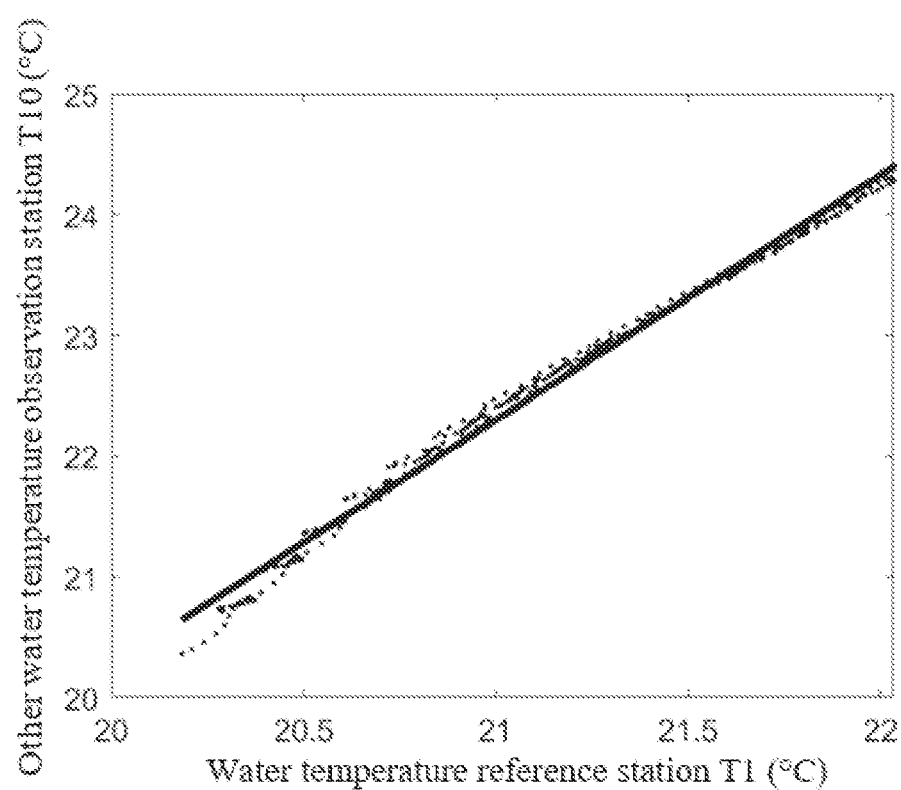
FIG. 15C is a schematic diagram of the correlation between Water temperature reference station T1 and other water temperature observation station T10 in the temperature rise reckoning numerical test provided in the specific embodiment of the present application.
Figure 15D:
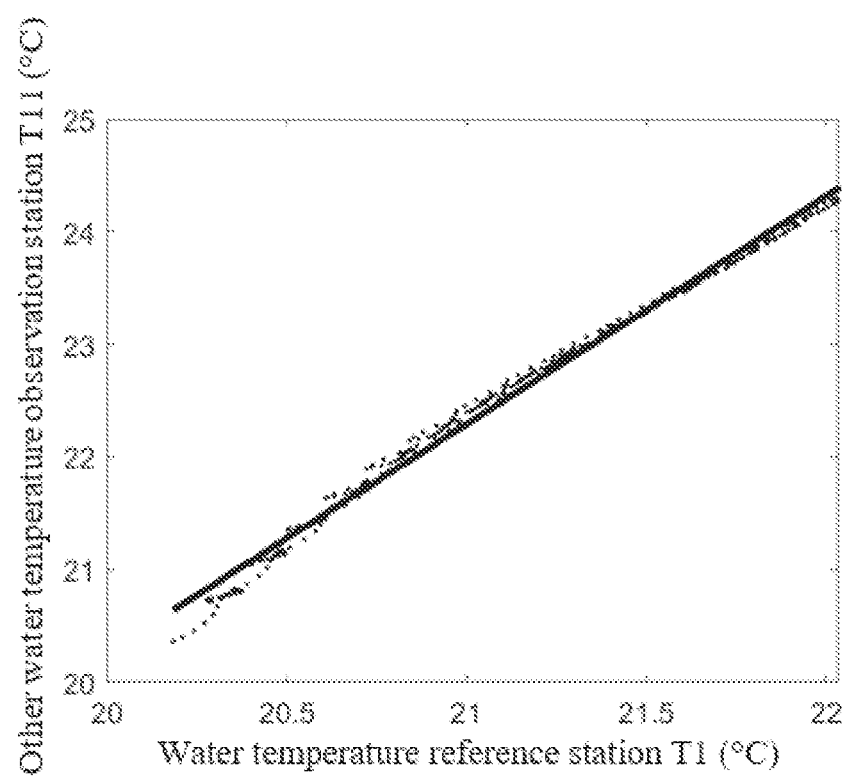
FIG. 15D is a schematic diagram of the correlation between Water temperature reference station T1 and other water temperature observation station T11 in the temperature rise reckoning numerical test provided in the specific embodiment of the present application.
Figure 15E:
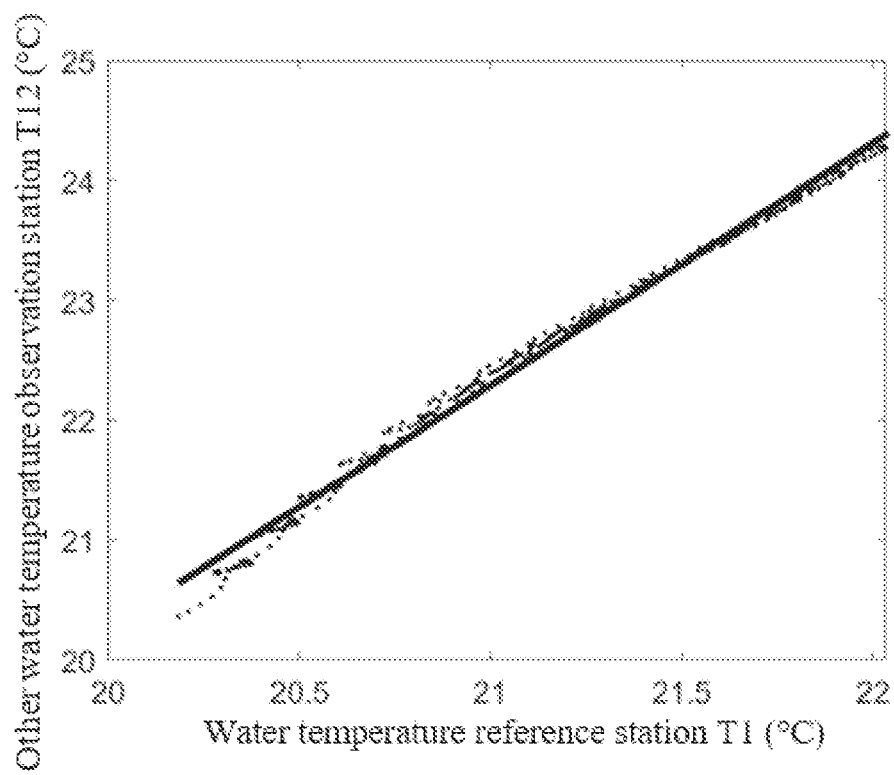
FIG. 15E is a schematic diagram of the correlation between Water temperature reference station T1 and other water temperature observation station T12 in the temperature rise reckoning numerical test provided in the specific embodiment of the present application.
Figure 15F:
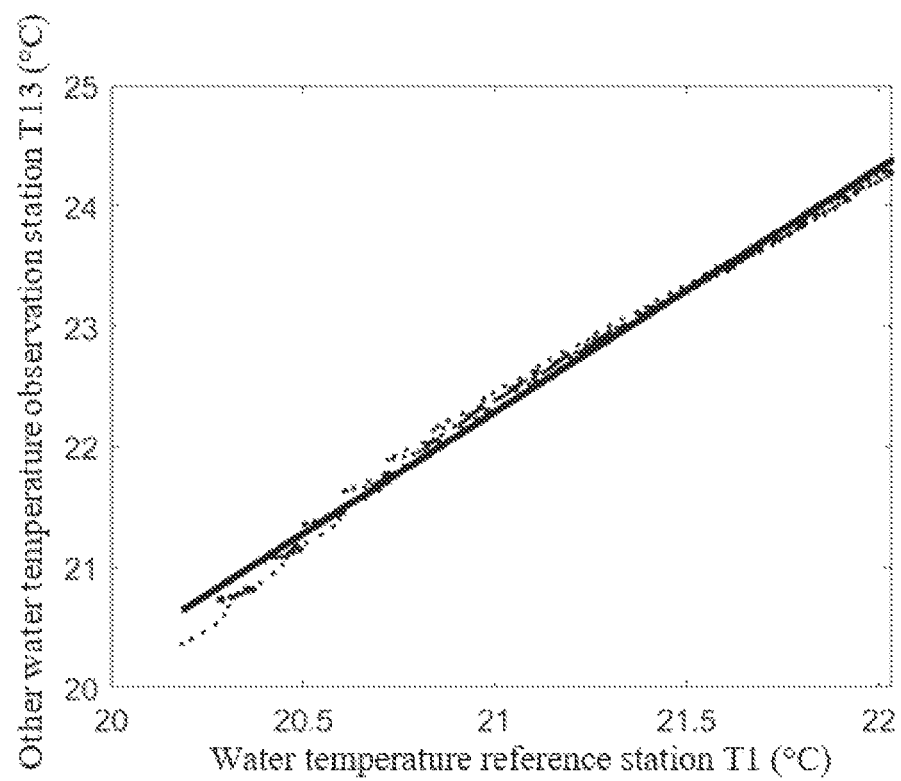
FIG. 15F is a schematic diagram of the correlation between Water temperature reference station T1 and other water temperature observation station T13 in the temperature rise reckoning numerical test provided in the specific embodiment of the present application.
Figure 16A:
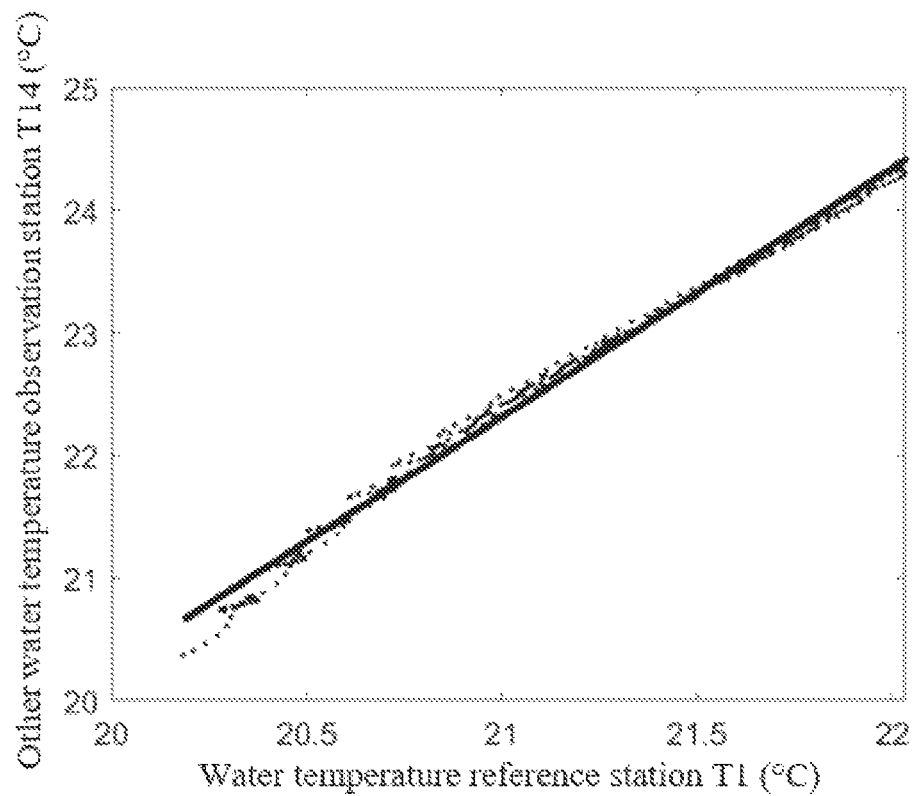
FIG. 16A is a schematic diagram of the correlation between Water temperature reference station T1 and other water temperature observation station T14s in the temperature rise reckoning numerical test provided in the specific embodiment of the present application.
Figure 16B:
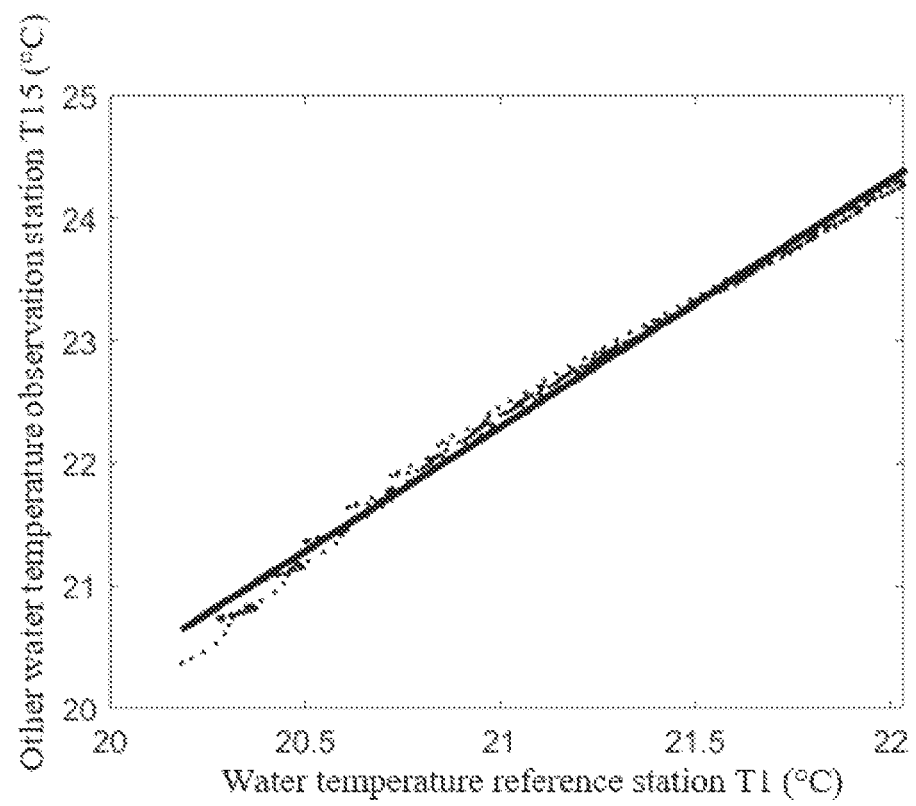
FIG. 16B is a schematic diagram of the correlation between Water temperature reference station T1 and other water temperature observation station T15s in the temperature rise reckoning numerical test provided in the specific embodiment of the present application.
Figure 16C:
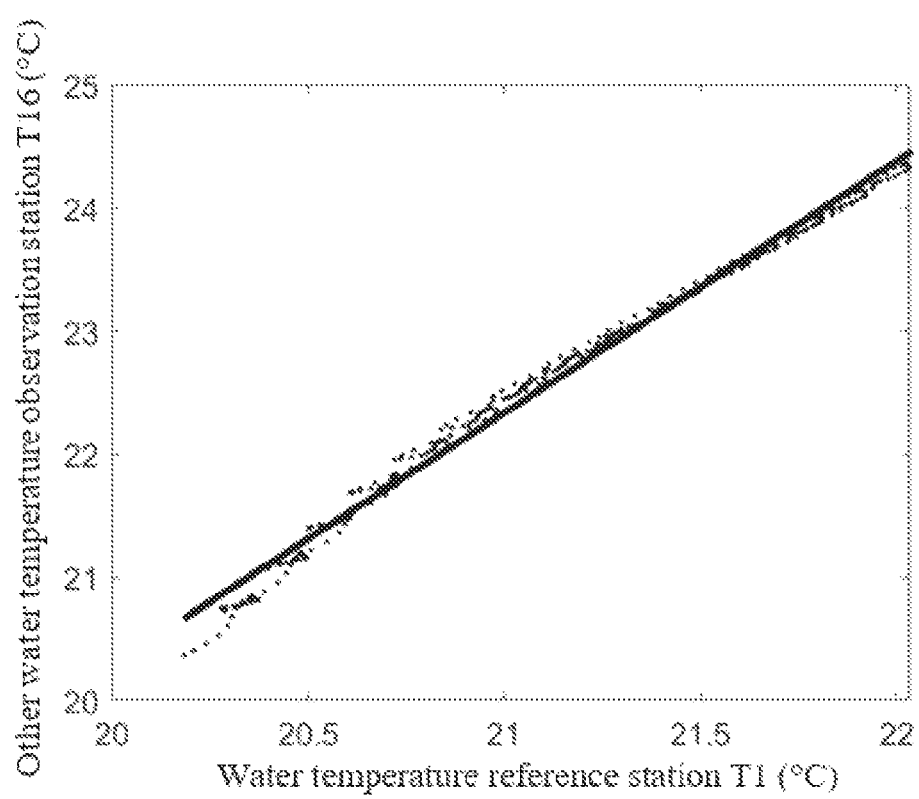
FIG. 16C is a schematic diagram of the correlation between Water temperature reference station T1 and other water temperature observation station T16s in the temperature rise reckoning numerical test provided in the specific embodiment of the present application.
Figure 16D:
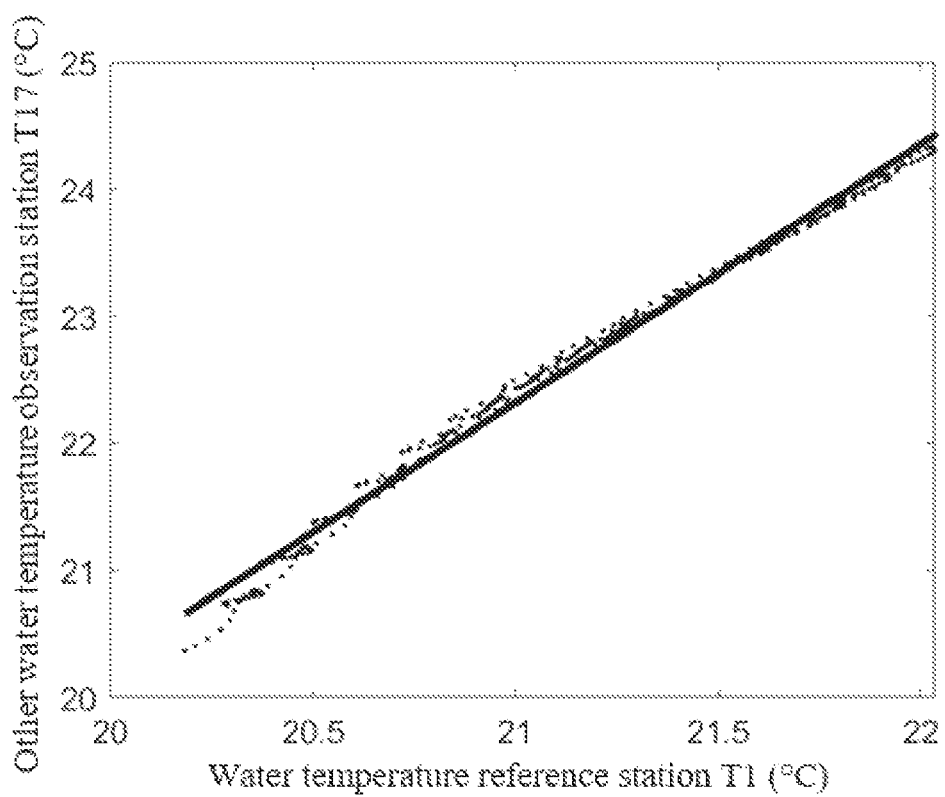
FIG. 16D is a schematic diagram of the correlation between Water temperature reference station T1 and other water temperature observation station T17s in the temperature rise reckoning numerical test provided in the specific embodiment of the present application.

As shown in FIG. 12 and FIG. 13, when the water temperature reference station (station T1) is selected, it is necessary to consider that station T1 will not be affected when there is warm water discharge, so an additional experiment of rectangular sea surface warm water discharge is made. The model water depth, topography, open boundary and wind driving are the same as those in Scheme 1 and Scheme 2, and the displacement of warm water discharge is the same as that in Scheme 2, with the discharge water temperature of 6° C. (the discharge water temperature is the temperature rise value), the initial field of water temperature of 0° C. and the heat exchange of sea surface of 0, and the running time of the model is the same as that of Scheme 1 and Scheme 2. The calculation results of the additional scheme show that the temperature of station T1 is not affected by the warm water discharge, and the velocity distribution of tidal current in the rectangular sea model is not very different, so station T1 may be used as a water temperature reference station. In addition, 16 other water temperature observation stations (T2-T7) are selected in the area affected by warm water discharge according to the calculation results of warm water discharge in Scheme 2. As shown in FIG. 14A, FIG. 14B, FIG. 14C, FIG. 14D, FIG. 14E, FIG. 14F, FIG. 15A, FIG. 15B, FIG. 15C, FIG. 15D, FIG. 15E, FIG. 15F, FIG. 16A, FIG. 16B, FIG. 16C and FIG. 16D, the correlations between hydrological reference station T1 and other water temperature observation stations (T2-T17) are analyzed, and the correlation coefficients are all above 0.99, and the reliability is all over 99%. The linear relationship between water temperature reference points and other water temperature observation stations is constructed.

TABLE 2

Correlation coefficient between water temperature reference station and other water temperature observation stations

| | Other water temperature observation stations | | | | | | | |
|---|---|---|---|---|---|---|---|---|
| | T2 | T3 | T4 | T5 | T6 | T7 | T8 | T9 |
| Correlation coefficient with t1 | 0.9955 | 0.9956 | 0.9957 | 0.9954 | 0.9956 | 0.9958 | 0.9959 | 0.9959 |

| | Other water temperature observation stations | | | | | | | |
|---|---|---|---|---|---|---|---|---|
| | T10 | T11 | T12 | T13 | T14 | T15 | T16 | T17 |
| Correlation coefficient with t1 | 0.9959 | 0.9961 | 0.9961 | 0.9962 | 0.9959 | 0.9962 | 0.9954 | 0.9956 |

TABLE 3

Summary of linear relationship between water temperature reference station and other water temperature observation stations water

| | Other water temperature observation stations | | |
|---|---|---|---|
| | T2 | T3 | T4 |
| Linear relationship with T1 | 2.042*t1-2.554 | 2.040*t1-20.511 | 2.037*t1-20.452 |

| | Other water temperature observation stations | | |
|---|---|---|---|
| | T5 | T6 | T7 |
| Linear relationship with T1 | 2.045*t1-20.618 | 2.040*t1-20.512 | 2.035*t1-20.414 |

| | Other water temperature observation stations | | |
|---|---|---|---|
| | T8 | T9 | T10 |
| Linear relationship with T1 | 2.032*t1-20.365 | 2.032*t1-20.352 | 2.029*t1-20.301 |

| | Other water temperature observation stations | | |
|---|---|---|---|
| | T11 | T12 | T13 |
| Linear relationship with T1 | 2.025*t1-20.236 | 2.023*t1-20.204 | 2.023*t1-20.197 |

| | Other water temperature observation stations | | |
|---|---|---|---|
| | T14 | T15 | T16 |
| Linear relationship with T1 | 2.031*t1-20.338 | 2.024*t1-20.214 | 2.046*t1-20.636 |

| | Other water temperature observation stations T17 |
|---|---|
| Linear relationship with T1 | 2.037*t1-20.451 |

② Calculation Result of Scheme 2 (with Warm Water Discharge)

Figure 17:
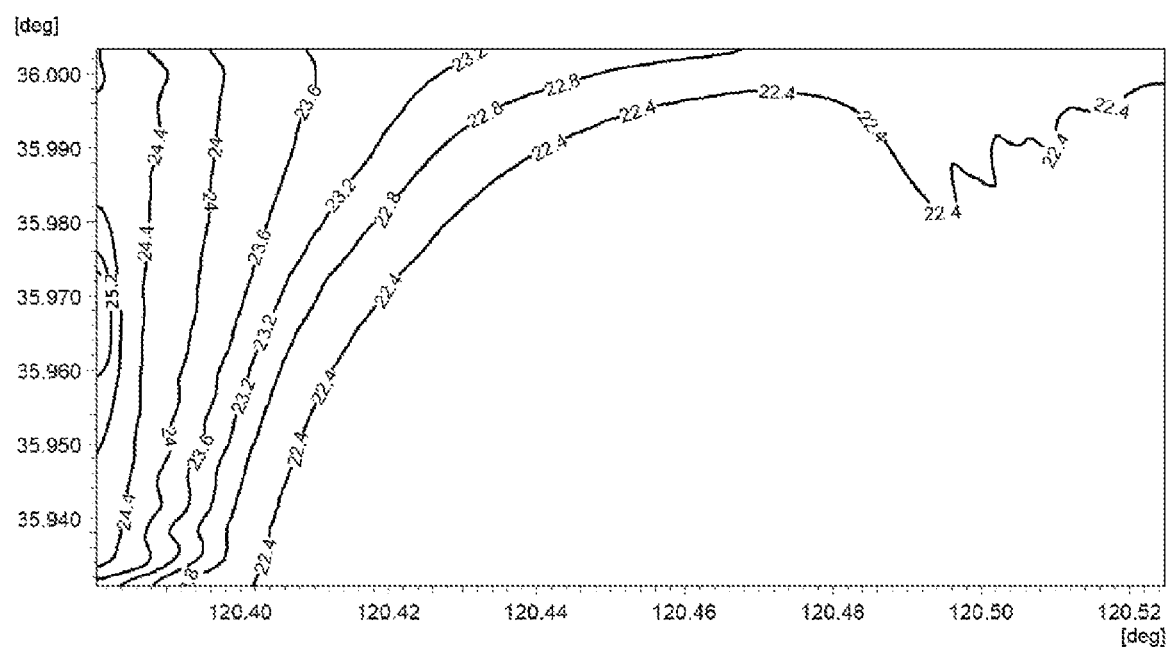
FIG. 17 is the maximum water temperature distribution diagram of Scheme 2 of the temperature rise reckoning numerical test provided in the specific embodiment of the present application.
Figure 18A:
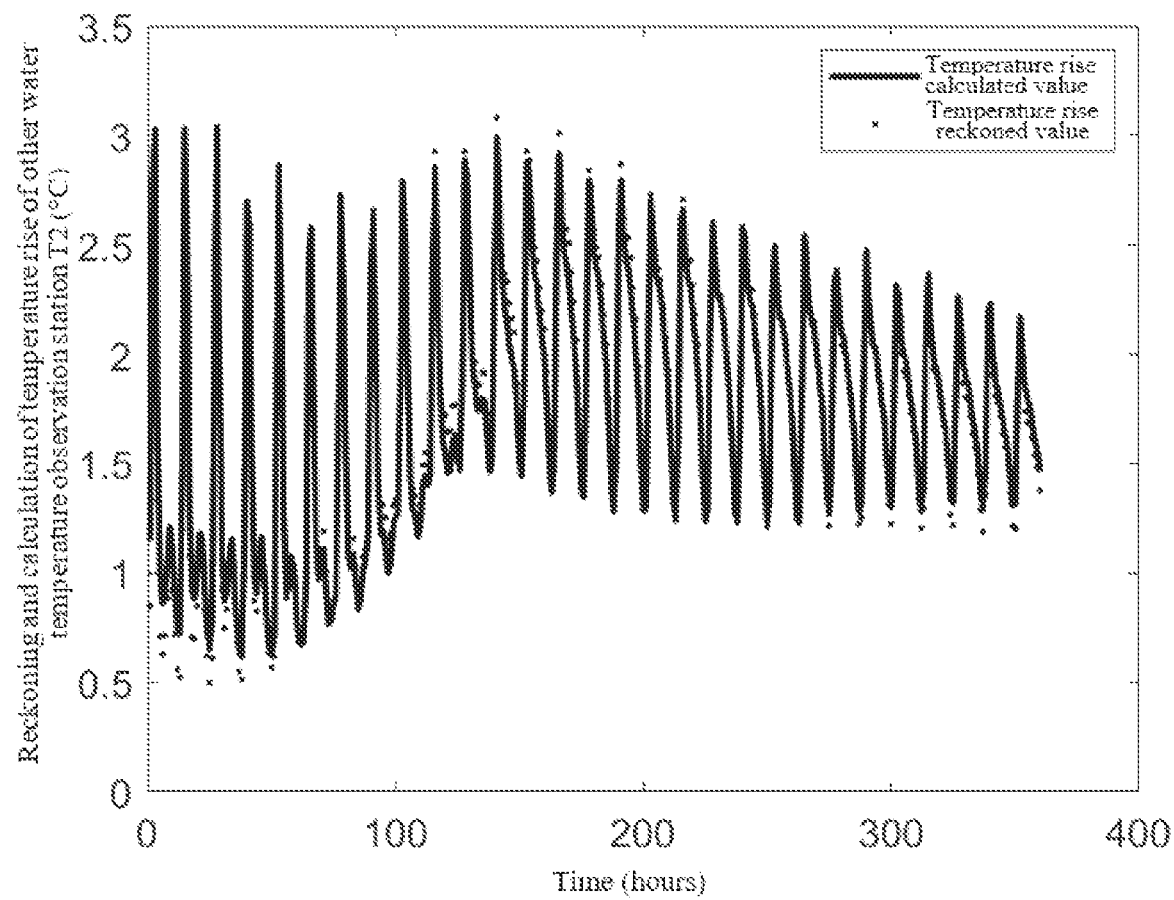
FIG. 18A is a curve graph of temperature rise calculated and reckoned values of other water temperature observation station T2 in Scheme 2 of the temperature rise reckoning numerical test provided in the specific embodiment of the present application.
Figure 18B:
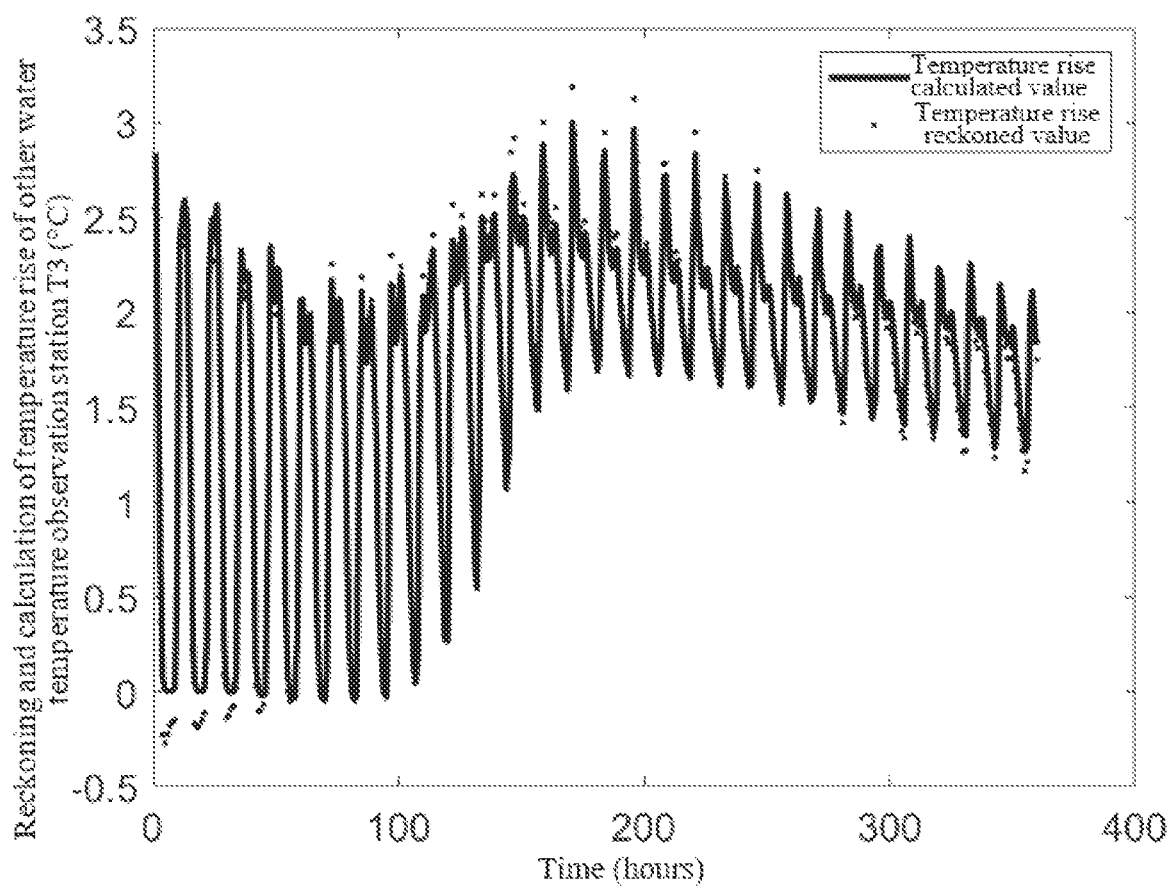
FIG. 18B is a curve graph of temperature rise calculated and reckoned values of other water temperature observation station T3 in Scheme 2 of the temperature rise reckoning numerical test provided in the specific embodiment of the present application.
Figure 18C:
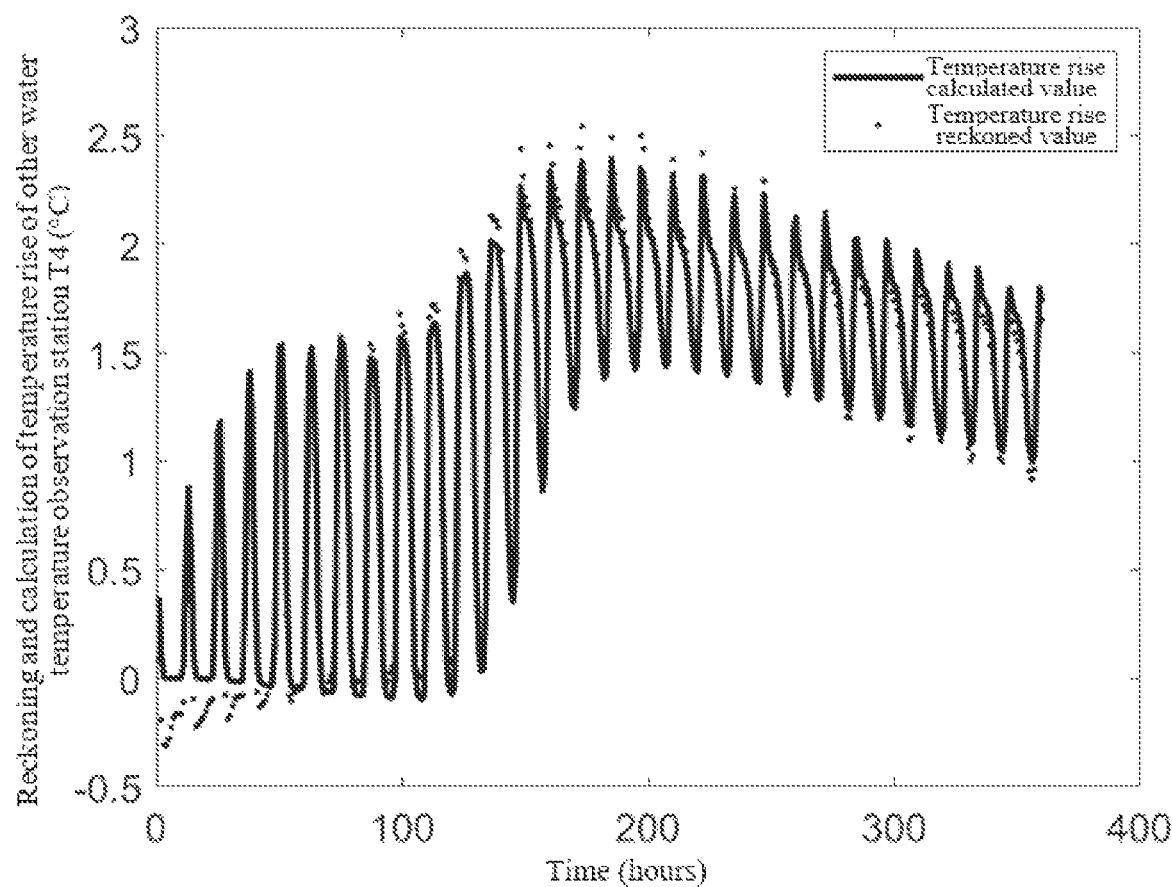
FIG. 18C is a curve graph of temperature rise calculated and reckoned values of other water temperature observation station T4 in Scheme 2 of the temperature rise reckoning numerical test provided in the specific embodiment of the present application.
Figure 18D:
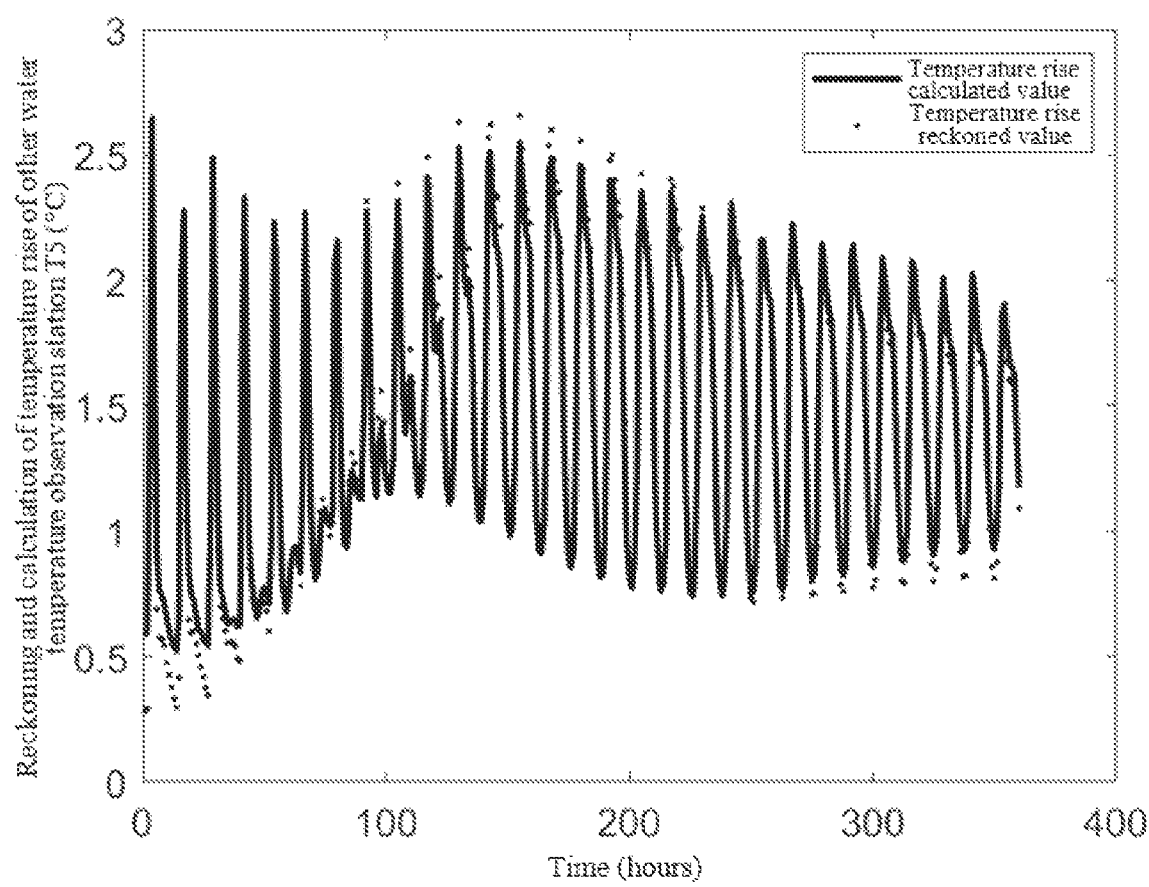
FIG. 18D is a curve graph of temperature rise calculated and reckoned values of other water temperature observation station T5 in Scheme 2 of the temperature rise reckoning numerical test provided in the specific embodiment of the present application.
Figure 19A:
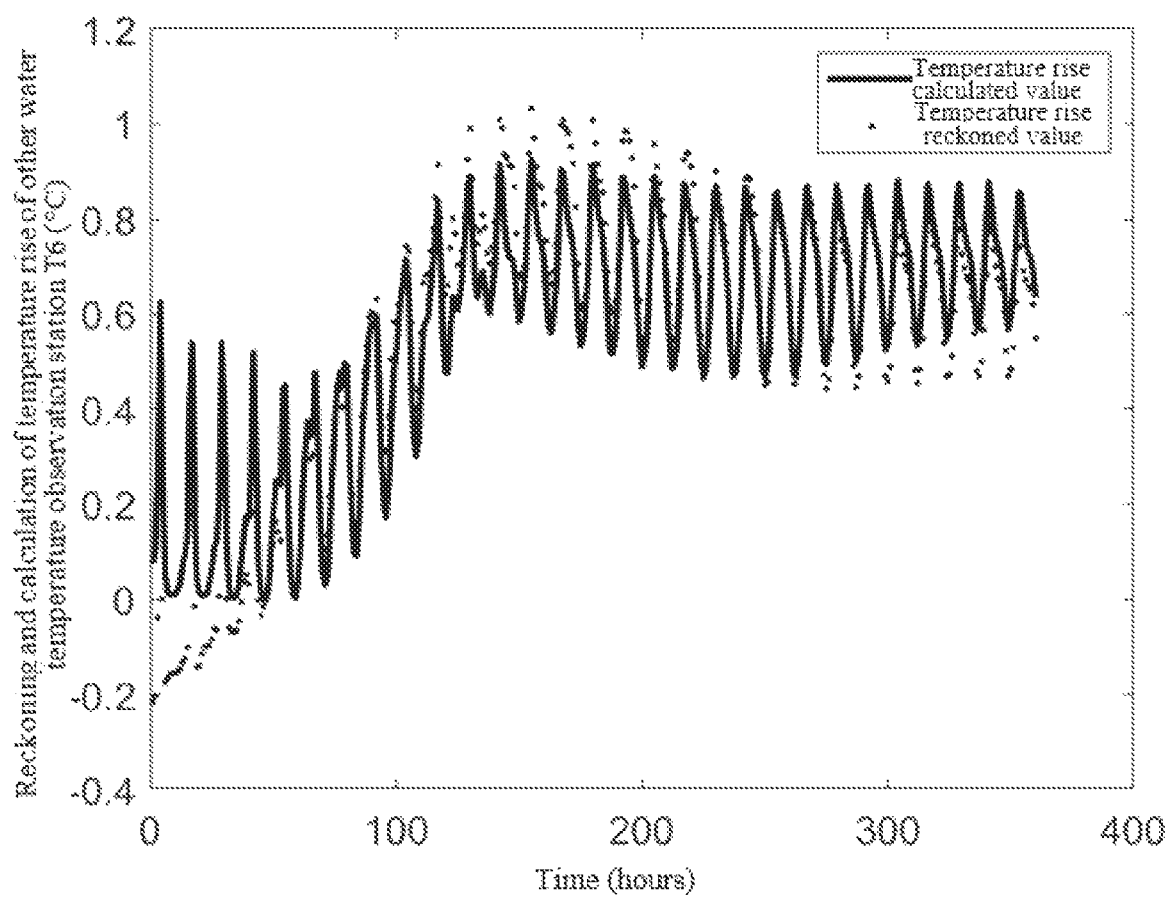
FIG. 19A is a curve graph of temperature rise calculated and reckoned values of other water temperature observation station T6 in Scheme 2 of the temperature rise reckoning numerical test provided in the specific embodiment of the present application.
Figure 19B:
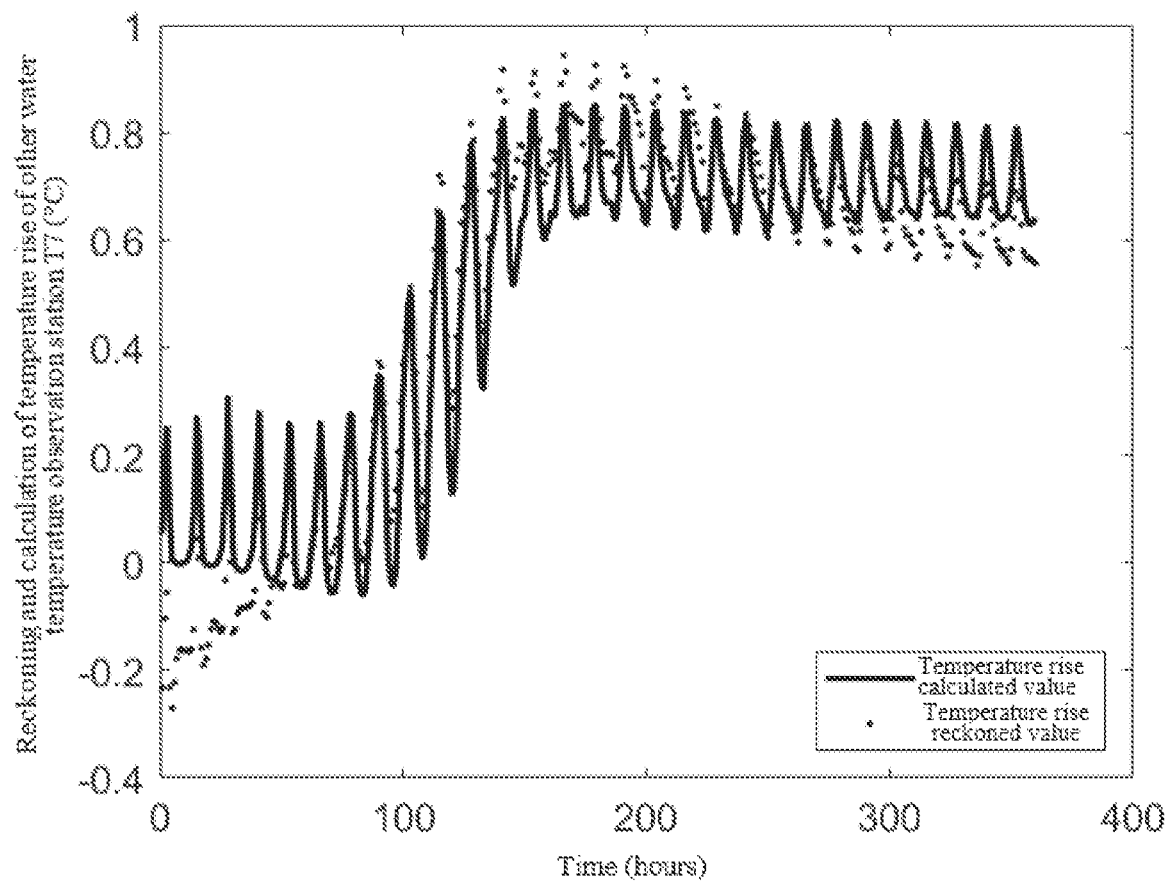
FIG. 19B is a curve graph of temperature rise calculated and reckoned values of other water temperature observation station T7 in Scheme 2 of the temperature rise reckoning numerical test provided in the specific embodiment of the present application.
Figure 19C:
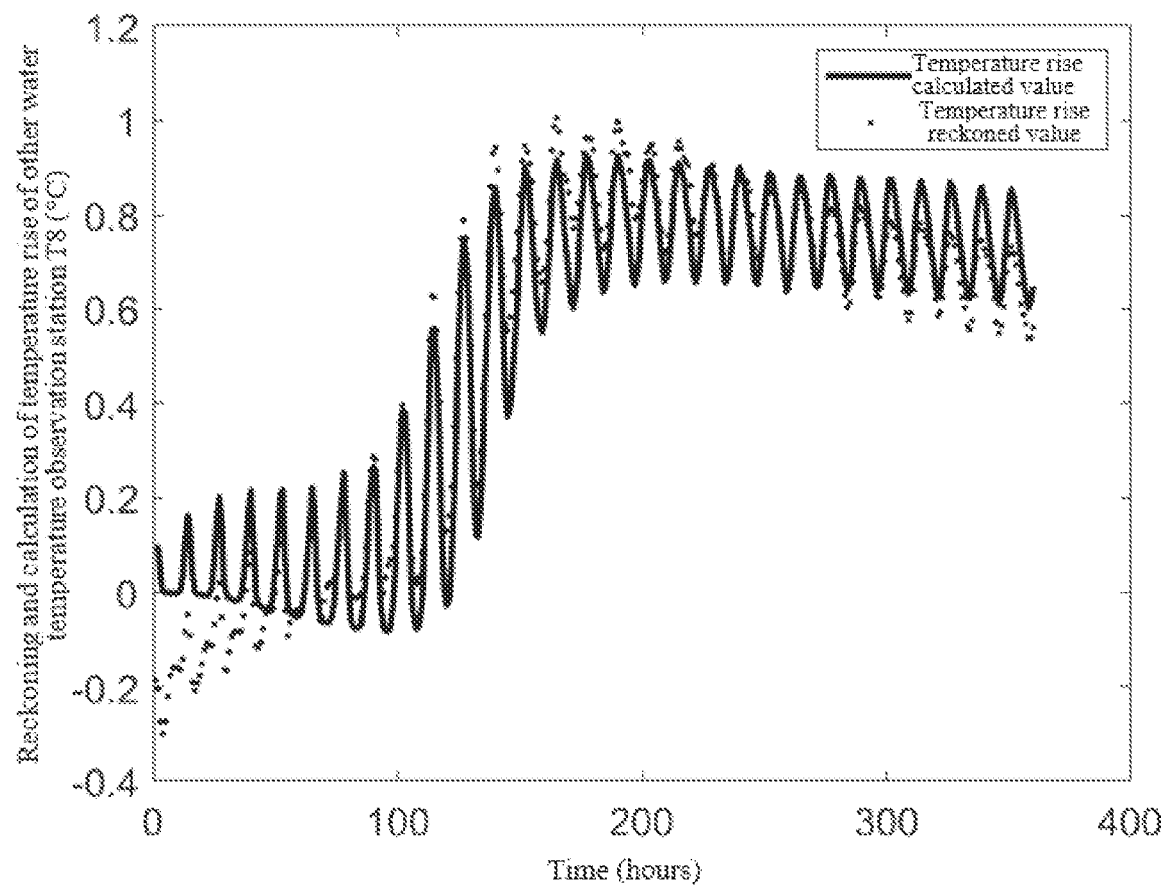
FIG. 19C is a curve graph of temperature rise calculated and reckoned values of other water temperature observation station T8 in Scheme 2 of the temperature rise reckoning numerical test provided in the specific embodiment of the present application.
Figure 19D:
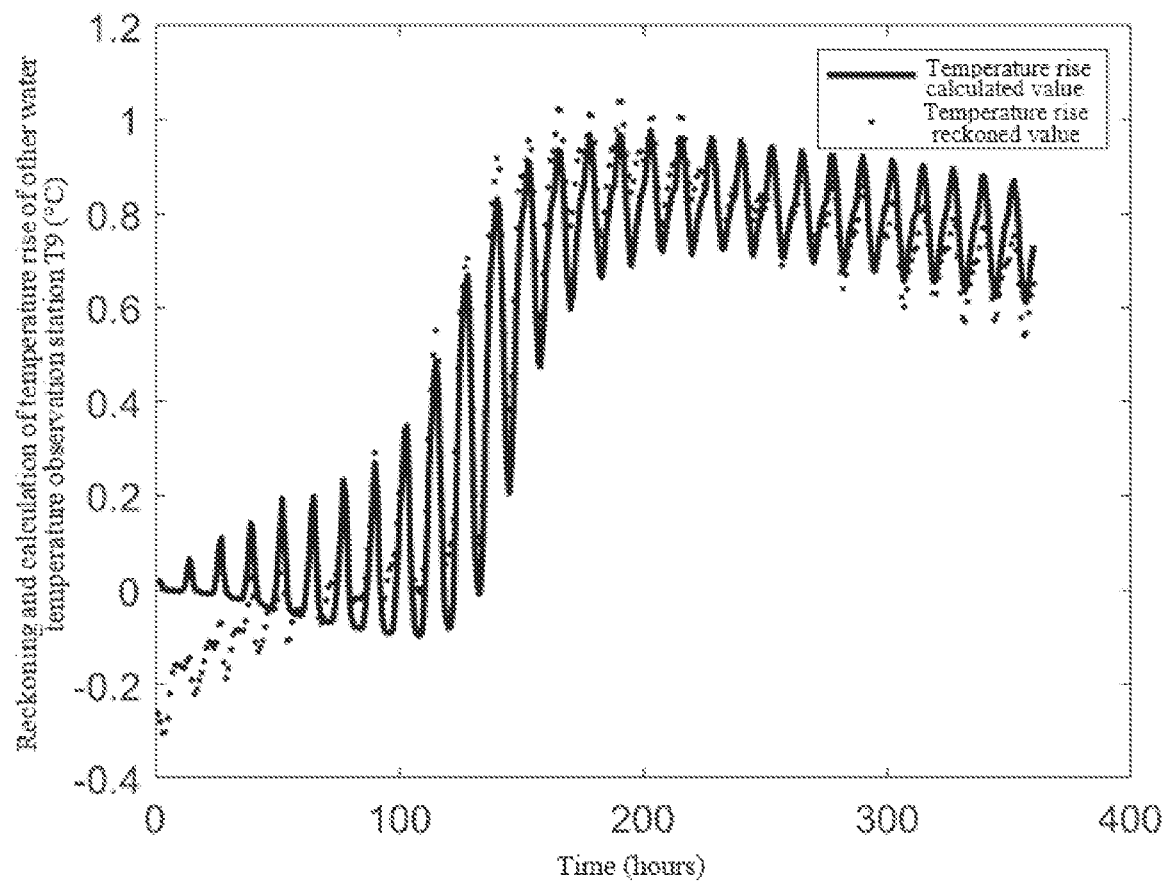
FIG. 19D is a curve graph of temperature rise calculated and reckoned values of other water temperature observation station T9 in Scheme 2 of the temperature rise reckoning numerical test provided in the specific embodiment of the present application.
Figure 20A:
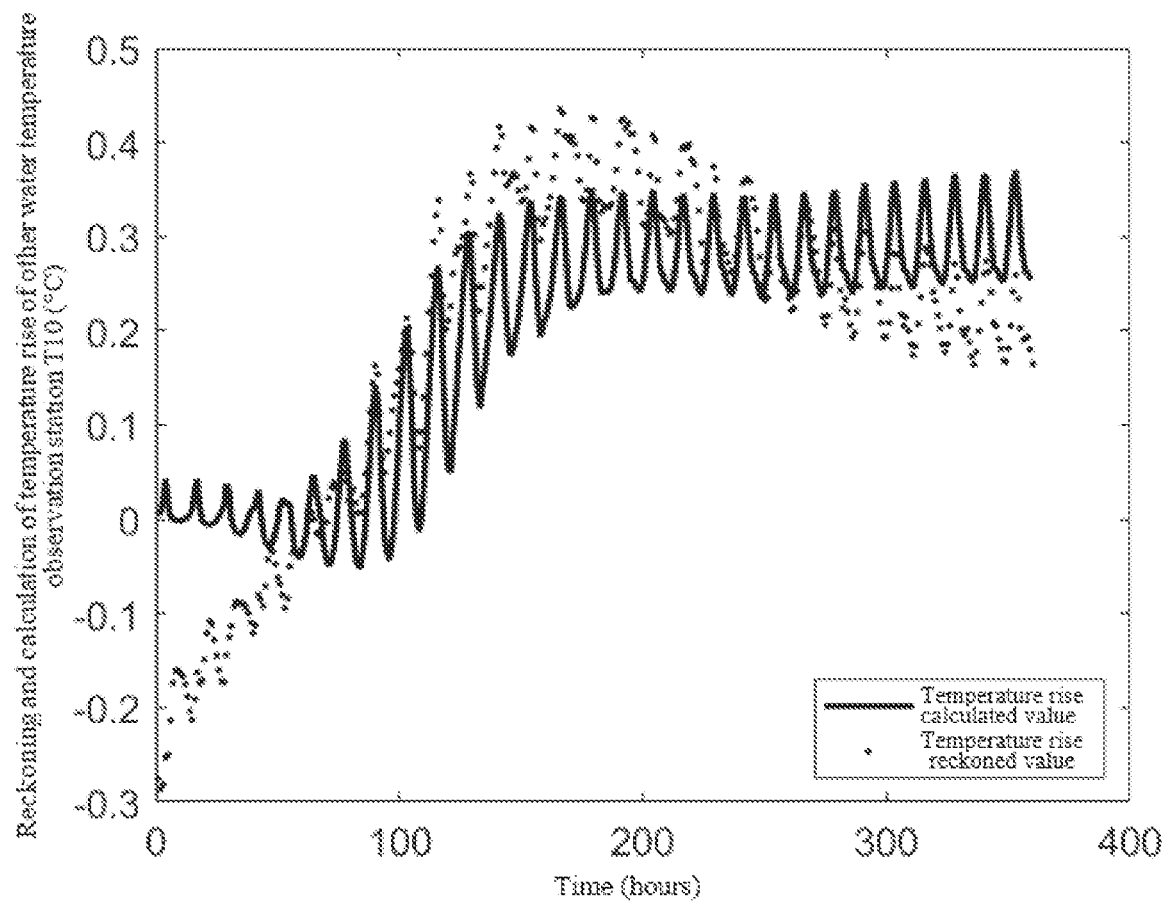
FIG. 20A is a curve graph of temperature rise calculated and reckoned values of other water temperature observation station T10 in Scheme 2 of the temperature rise reckoning numerical test provided in the specific embodiment of the present application.
Figure 20B:
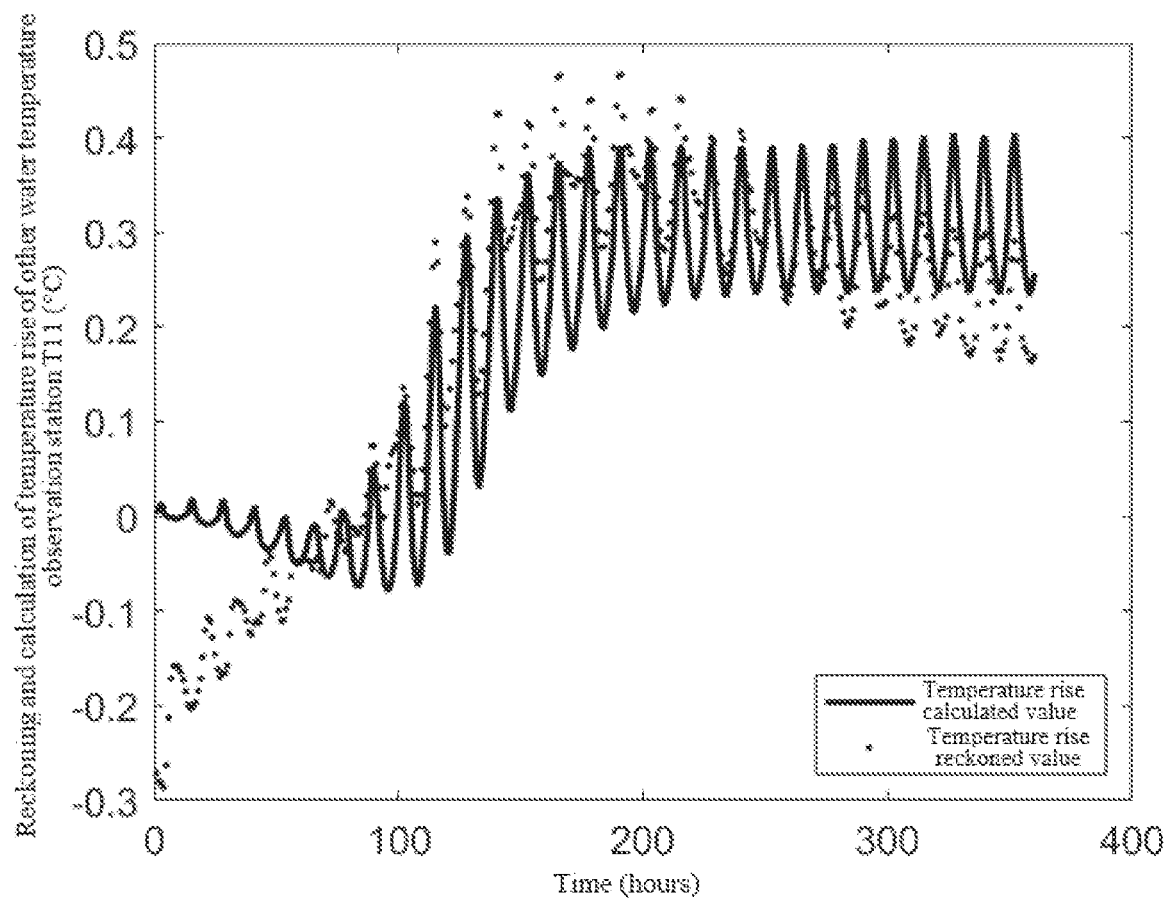
FIG. 20B is a curve graph of temperature rise calculated and reckoned values of other water temperature observation station T11 in Scheme 2 of the temperature rise reckoning numerical test provided in the specific embodiment of the present application.
Figure 20C:
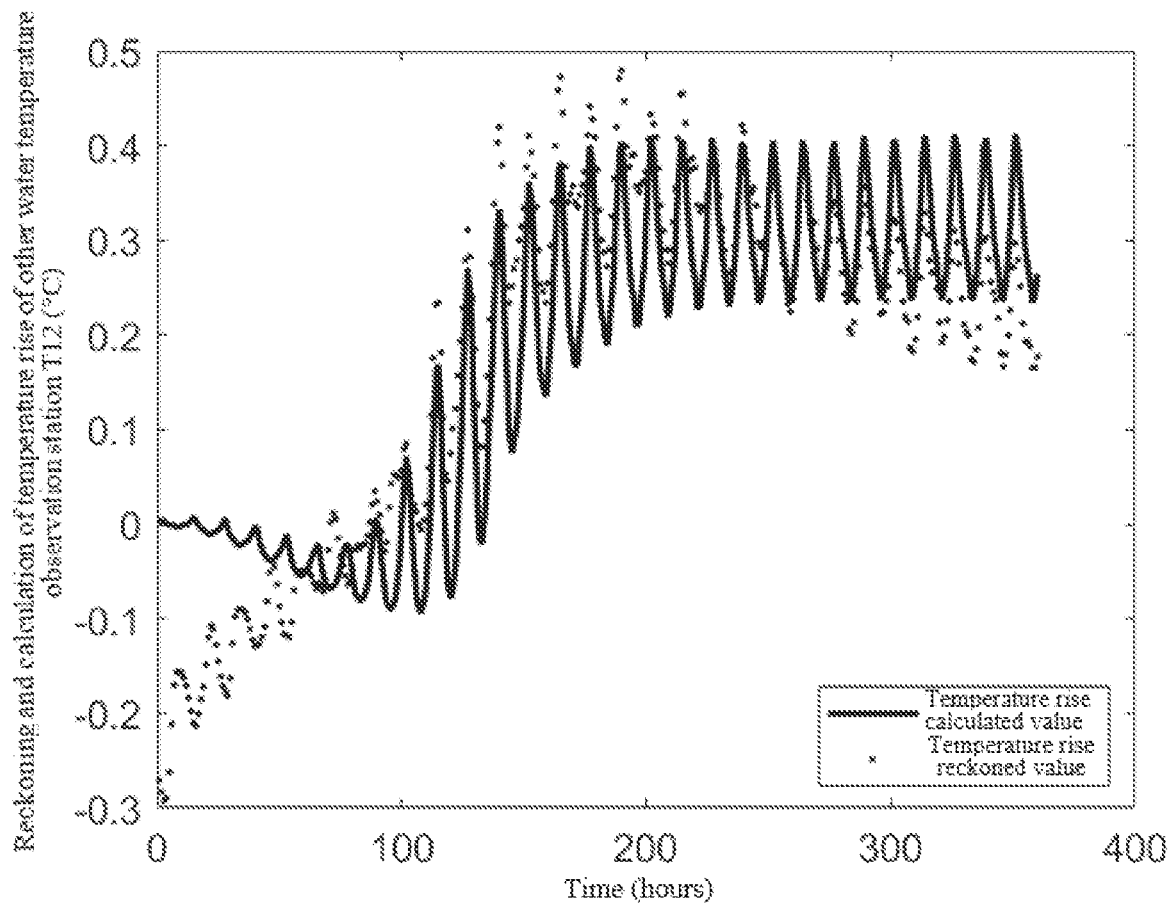
FIG. 20C is a curve graph of temperature rise calculated and reckoned values of other water temperature observation station T12 in Scheme 2 of the temperature rise reckoning numerical test provided in the specific embodiment of the present application.
Figure 20D:
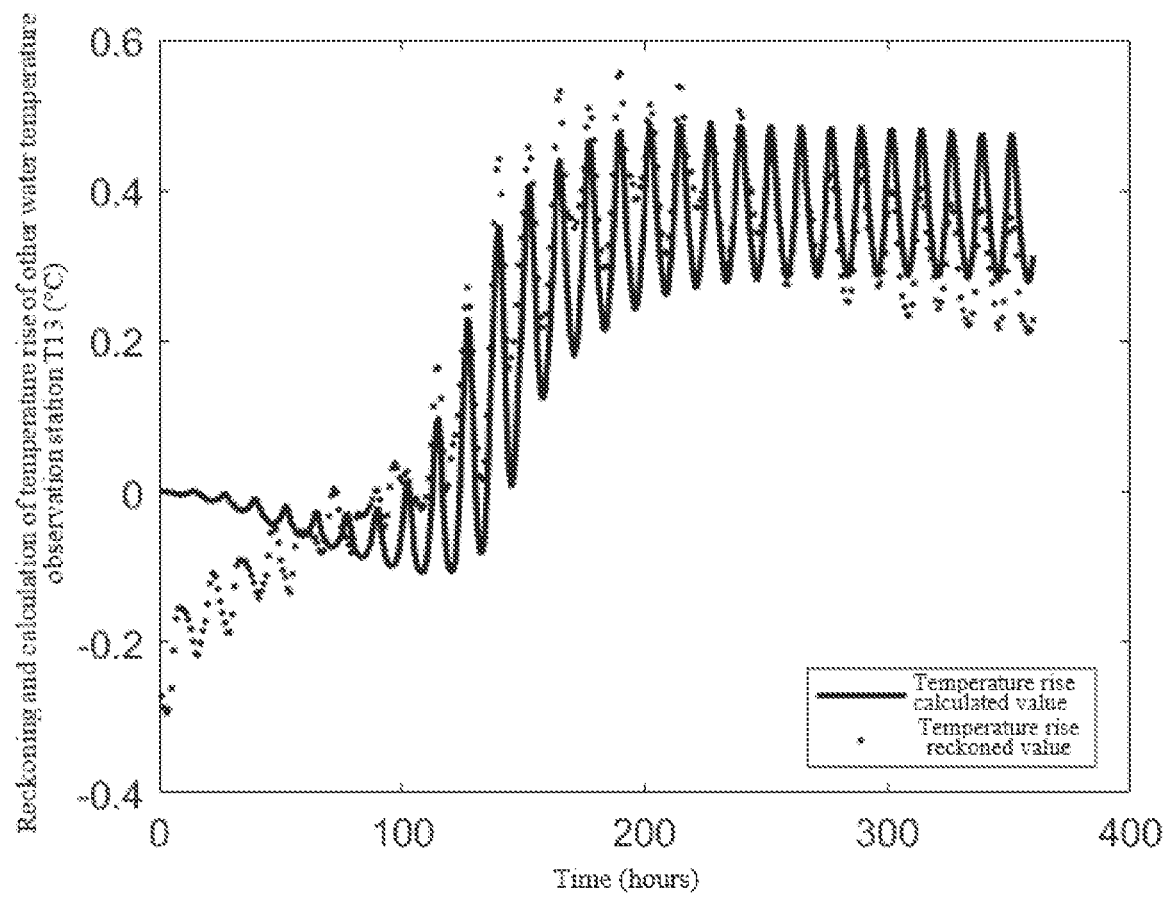
FIG. 20D is a curve graph of temperature rise calculated and reckoned values of other water temperature observation station T13 in Scheme 2 of the temperature rise reckoning numerical test provided in the specific embodiment of the present application.
Figure 21A:
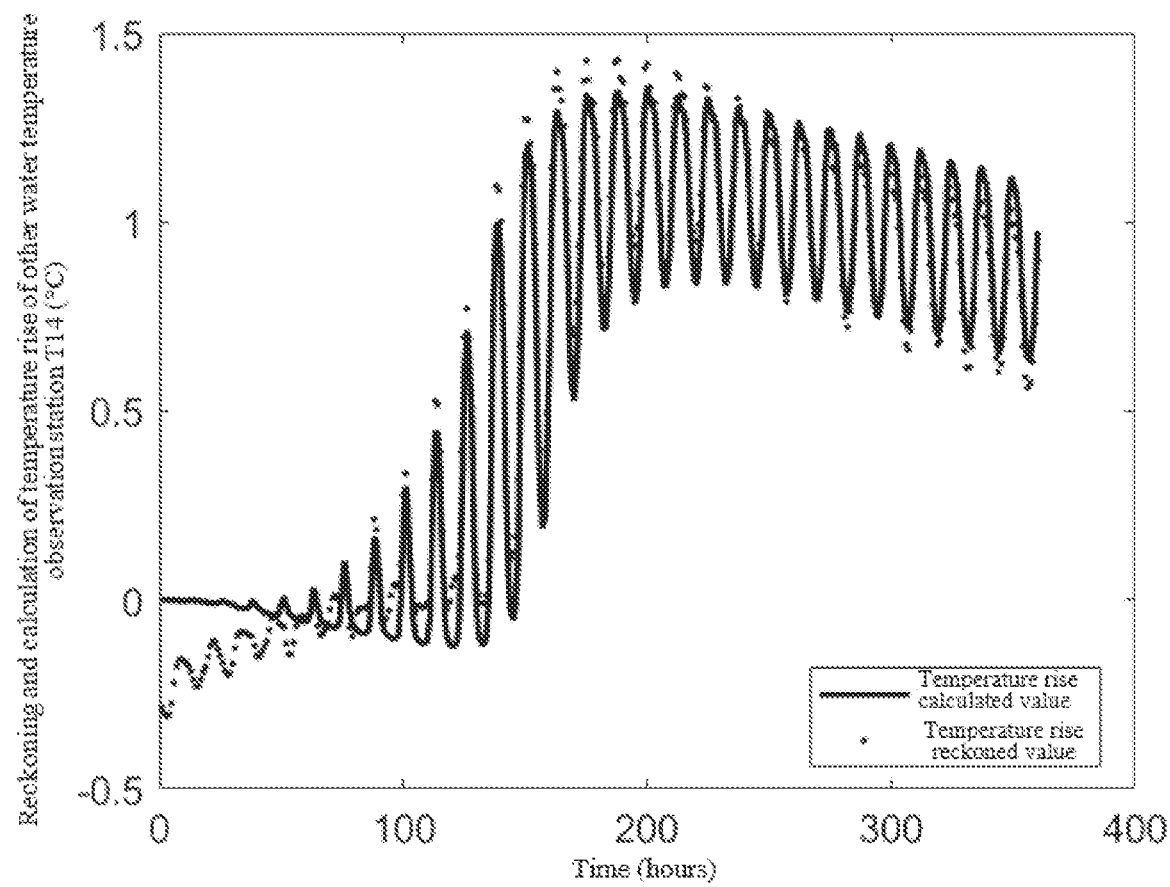
FIG. 21A is a curve graph of temperature rise calculated and reckoned values of other water temperature observation station T14 in Scheme 2 of the temperature rise reckoning numerical test provided in the specific embodiment of the present application.
Figure 21B:
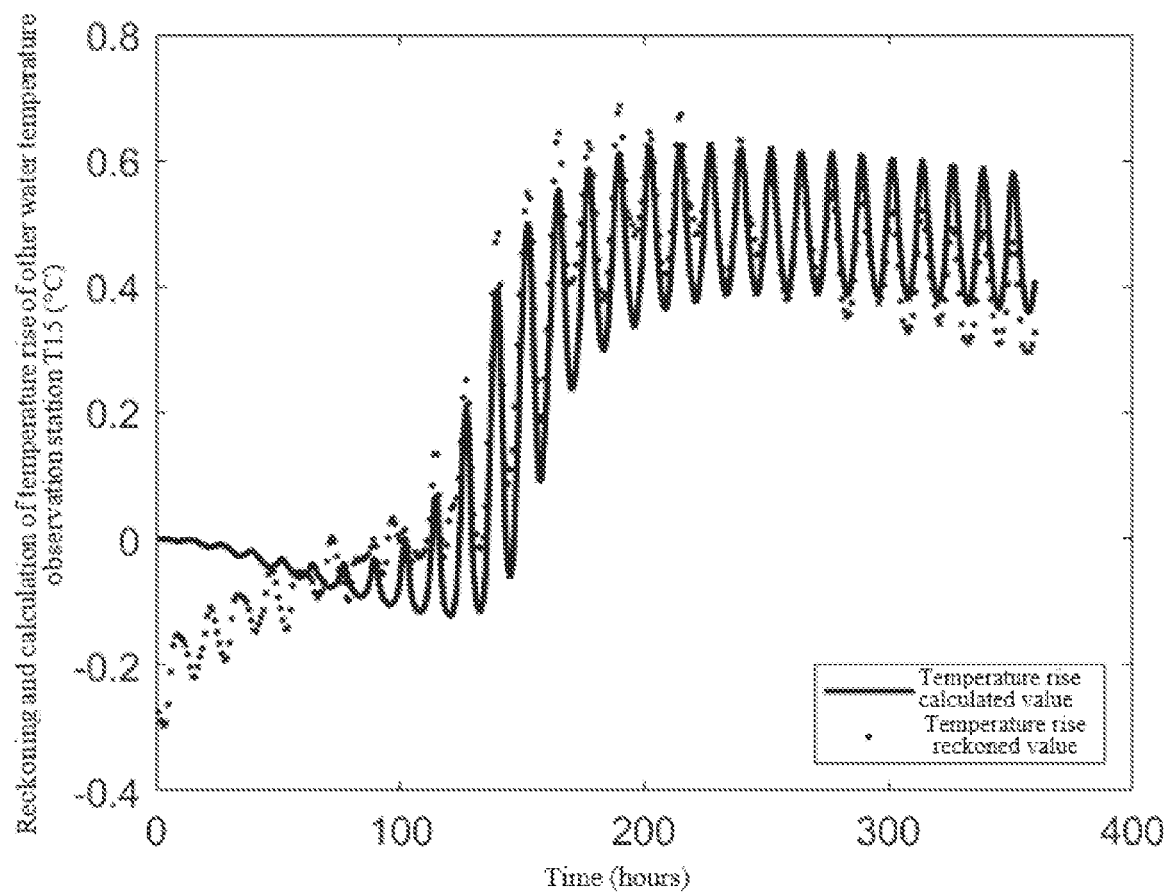
FIG. 21B is a curve graph of temperature rise calculated and reckoned values of other water temperature observation station T15 in Scheme 2 of the temperature rise reckoning numerical test provided in the specific embodiment of the present application.
Figure 21C:
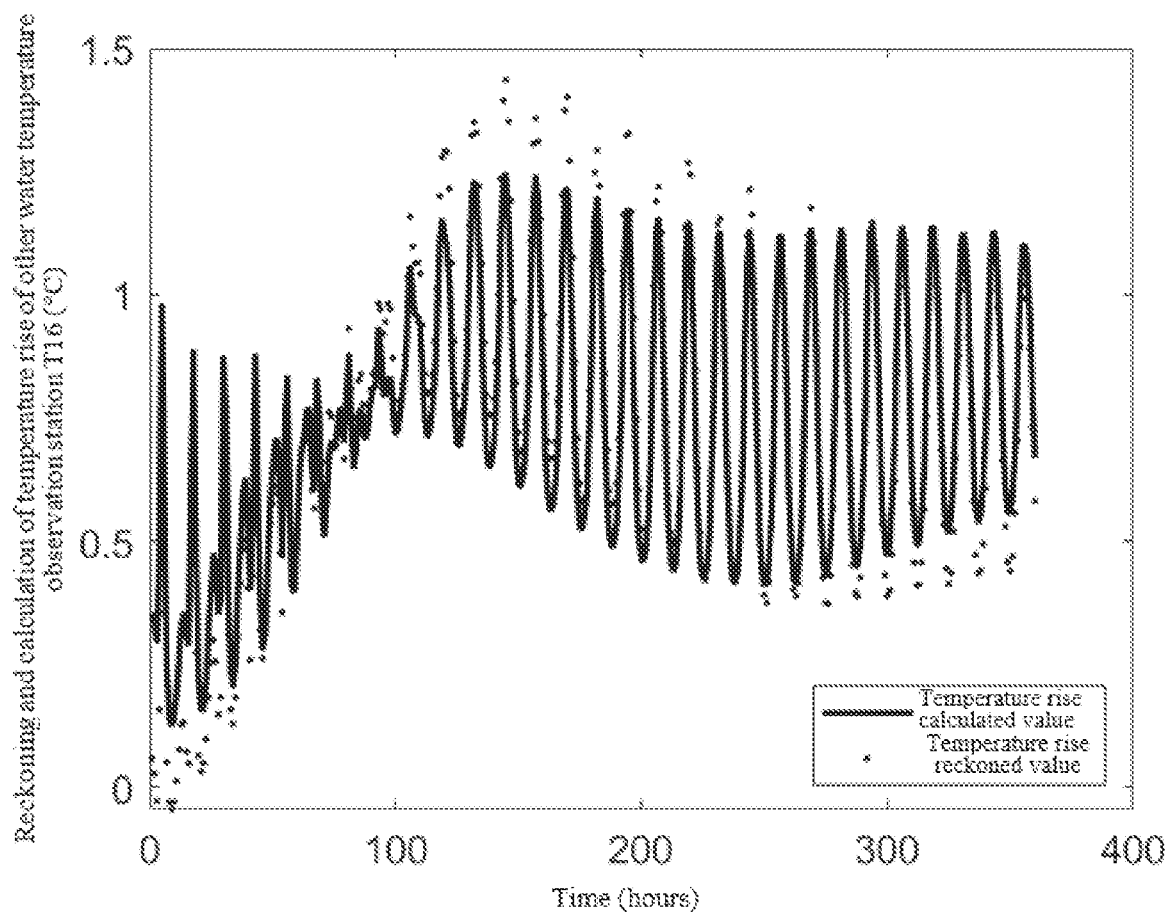
FIG. 21C is a curve graph of temperature rise calculated and reckoned values of other water temperature observation station T16 in Scheme 2 of the temperature rise reckoning numerical test provided in the specific embodiment of the present application.
Figure 21D:
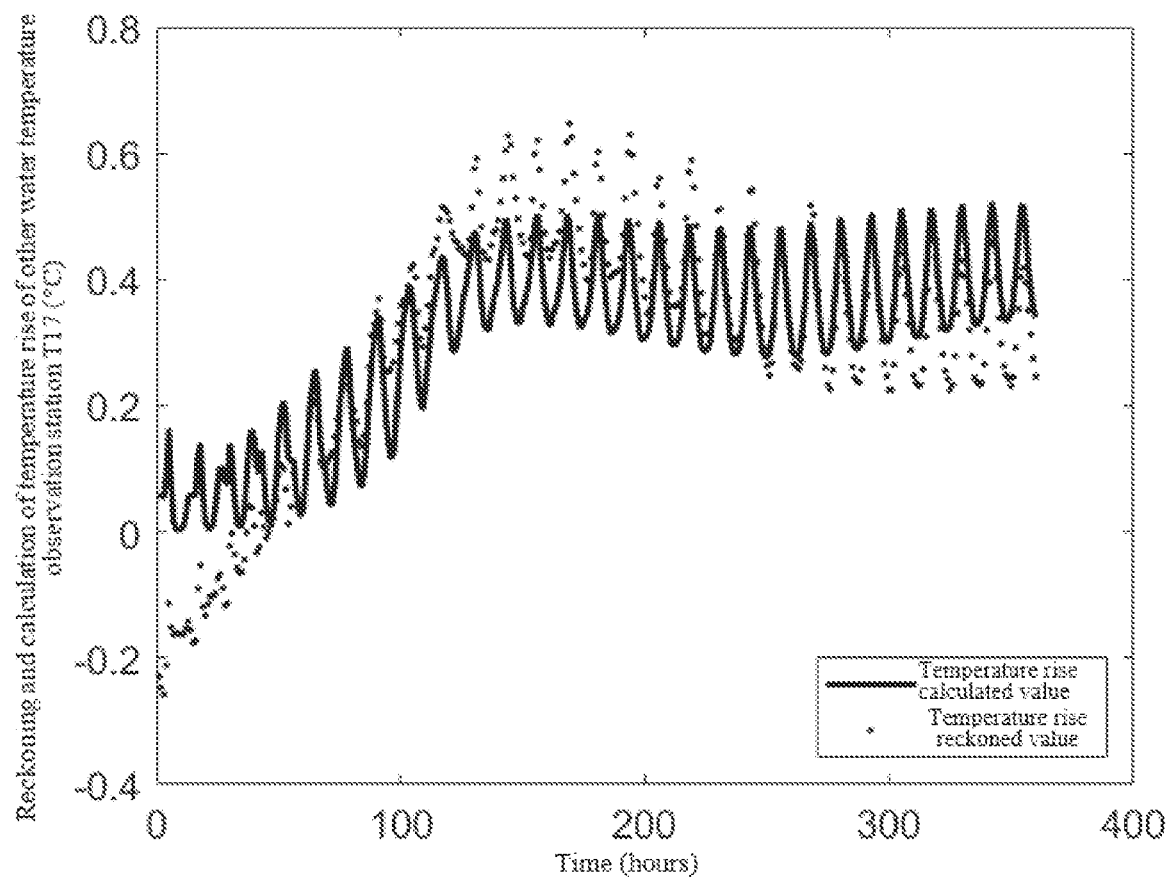
FIG. 21D is a curve graph of temperature rise calculated and reckoned values of other water temperature observation station T17 in Scheme 2 of the temperature rise reckoning numerical test provided in the specific embodiment of the present application.

As shown in FIG. 17, when there is warm water discharge, the water temperature is mainly affected by the warm water discharge to the west and northwest of the rectangular sea. Comparing the temperature difference between other water temperature observation stations in Scheme 2 and Scheme 1, this temperature difference is the temperature rise of other water temperature observation stations caused by warm water discharge (since the sea surface heat flux input in this rectangular sea model is the same, the water temperature difference between Scheme 2 and Scheme 1 is the temperature rise value caused by warm water discharge), and the temperature rise value of Scheme 2=the water temperature of other water temperature observation stations in Scheme 2—the water temperature of other water temperature observation stations in Scheme 1. At the same time, according to the linear relationship between the water temperature reference station and other water temperature observation stations, the environmental background water temperature of other water temperature observation stations in Scheme 2 is obtained. The difference between the water temperature of other water temperature observation stations in Scheme 2 and the reckoned environmental background water temperature is the reckoned temperature rise value, and the reckoned temperature rise value in Scheme 2=the water temperature of other water temperature observation stations in Scheme 2—the reckoned environmental background water temperature of other water temperature observation stations.

③ Comparative Analysis

As shown in FIG. 18A, FIG. 18B, FIG. 18C, FIG. 18D, FIG. 19A, FIG. 19B, FIG. 19C, FIG. 19D, FIG. 20A, FIG. 20B, FIG. 20C, FIG. 20D, FIG. 21A, FIG. 21B, FIG. 21C and FIG. 21D, the feasibility of this method is verified by comparing the mean square deviation of the difference value between the calculated temperature rise value and the reckoned temperature rise value (calculated temperature rise value in Scheme 2=water temperature of other water temperature observation stations in Scheme 2—water temperature of other water temperature observation stations in Scheme 1, and reckoned temperature rise value in Scheme 2=water temperature of other water temperature observation stations-reckoned environmental background water temperature of other water temperature observation stations). By calculating the mean square deviation of the difference between the calculated temperature rise value and the reckoned temperature rise value, it can be seen that the mean square deviation of each station is very small.

TABLE 4

Summary of mean square deviation of the difference between calculated temperature rise value and reckoned temperature rise value

| Station | T2 | T3 | T4 | T5 | T6 | T7 | T8 | T9 |
|---|---|---|---|---|---|---|---|---|
| Mean square deviation | 0.010 | 0.010 | 0.009 | 0.010 | 0.010 | 0.009 | 0.009 | 0.009 |

TABLE 4-continued

Summary of mean square deviation of the difference between calculated temperature rise value and reckoned temperature rise value

| Station | T10 | T11 | T12 | T13 | T14 | T15 | T16 | T17 |
|---|---|---|---|---|---|---|---|---|
| Mean square deviation | 0.009 | 0.009 | 0.008 | 0.008 | 0.009 | 0.008 | 0.010 | 0.010 |

4. Test Conclusion

The above rectangular sea numerical calculation test shows that after building the linear relationship between the water temperature of the water temperature reference station and other water temperature observation stations before the operation of the newly-built coastal power plant, after the operation of the newly-built coastal power plant, and after the other water temperature observation stations are affected by warm water discharge, the environmental background water temperature of other water temperature observation stations after the operation of the newly-built coastal power plant may be reckoned through the water temperature obtained by synchronous observation of other water temperature observation stations and the linear relationship between the water temperature reference station and other water temperature observation stations, and the difference between the water temperature of other water temperature observation stations after the operation of the coastal power plant and the environmental background water temperature obtained by synchronous reckoning is the synchronous temperature rise of this station. Meanwhile, the experimental results of rectangular sea numerical calculation also show that the accuracy of reckoning the environmental background water temperature of other water temperature observation stations by the water temperature reference station is higher, so that the accuracy of temperature rise value is also higher.

The present application has been described by preferred embodiments, and those skilled in the art will know that various changes and equivalent substitutions may be made to these features and embodiments without departing from the spirit and scope of the present application. The application is not limited by the specific embodiments disclosed here, and other embodiments that fall within the claims of this application are within the scope of protection of the application.

What is claimed is:

1. A method for reckoning environmental background water temperatures in a temperature rise area of a coastal power plant, comprising:

Step01, before an operation of the coastal power plant, selecting at least one position based on background characteristics of a hydrological environment of a discharge port of the coastal power plant on a shore or in a sea at a sea area surrounding the discharge port of the coastal power plant to build at least one water temperature reference station; wherein a station position of the at least one water temperature reference station is not more than 20 km away from the discharge port of the coastal power plant, and characteristics of a water depth, a sea current and a sea surface heat flux are the same as characteristics of the sea area surrounding the discharge port of the coastal power plant, and are not affected by cold and heat sources, and coastlines surrounding the water temperature reference station will not be artificially changed in a future;

calculating a maximum temperature rise envelope of the warm water discharge through a temperature rise mathematical model, and selecting sites within the maximum temperature rise envelope range of the warm water discharge to build a plurality of other water temperature observation stations; when building the plurality of other water temperature observation stations, according to the maximum temperature rise envelope calculated by the temperature rise mathematical model and a present situation of sea area development and utilization, selecting suitable positions for building the plurality of other water temperature observation stations on temperature rise envelopes of 1° C., 2° C., 3° C. and 4° C., and selecting two or three of the plurality of other water temperature observation stations for each of temperature rise envelopes to carry out a water temperature observation in seasons; in addition, setting up 3 or more the other water temperature observation stations between a temperature rise range of 1° C. temperature rise and 0.5° C. temperature rise given by the temperature rise mathematical model;

the water temperature reference station is the same as the plurality of other water temperature observation stations in terms of sea current distribution characteristics, water depth topography characteristics and meteorological conditions, and a distance between the water temperature reference station and the other water temperature observation stations is less than 30 kilometers, there is a linear relationship in the environmental background water temperatures monitored by the water temperature reference station and the plurality of other water temperature observation stations;

the environmental background water temperatures are observed values of sea surface water temperatures not affected by heat sources of the coastal power plant through a probe on a sea surface; the probe on the sea surface is arranged at a distance of 0.5 meter from the sea surface;

Step02, carrying out a synchronous continuous observation of the sea surface water temperatures of the water temperature reference station and the plurality of other water temperature observation stations, and recording the environmental background water temperatures of the water temperature reference station and the plurality of other water temperature observation stations;

Step03, analyzing the environmental background water temperatures obtained in the Step02, and building a linear relationship of the environmental background water temperatures between the water temperature reference station and each of the plurality of other water temperature observation stations, wherein the linear relationship comprises a seasonal linear relationship, and the linear relationship is $B=AX+C$, wherein B represents environmental background water temperatures monitored by water temperature observation stations, A represents an environmental background water temperatures monitored by the water temperature reference station, and X and C are correlation coefficients; and Step04, after the operation of the coastal power plant, continuously observing the environmental background water temperatures of the water temperature reference station, and according to the environmental background water temperatures of the water temperature reference station, reckoning and obtaining the environmental background water temperatures of each of the plurality of other water temperature observation stations through the linear relationship of the environmental background water temperatures between the water temperature reference station and each of the plurality of other water temperature observation stations obtained in the Step03.

2. The method for reckoning the environmental background water temperatures in the temperature rise area of the coastal power plant according to claim 1, further comprising obtaining an environmental background water temperature field distribution by carrying out an interpolation in a range on obtained environmental background water temperatures of the plurality of the other water temperature observation stations or obtained environmental background water temperatures reckoned by the plurality of other water temperature observation stations.

3. The method for reckoning the environmental background water temperatures in the temperature rise area of the coastal power plant according to claim 1, wherein the Step02 also comprises a correlation analysis of the observed values of the sea surface water temperatures of the water temperature reference station and the plurality of other water temperature observation stations for one month:

if the correlation coefficient X between the observed values of the sea surface water temperatures of the plurality of other water temperature observation stations and observed values of the sea surface water temperatures of the water temperature reference station is above 0.85, the plurality of other water temperature observation stations with a reliability of over 95% are kept and observed continuously, and the plurality of other water temperature observation stations with the correlation coefficient X below 0.85 are stopped or relocated;

if the correlation coefficient X of the observed values of the sea surface water temperatures between the water temperature reference station and more than 50% of the plurality of other water temperature observation stations is lower than 0.85, the water temperature reference station is abandoned or relocated.

4. The method for reckoning the environmental background water temperatures in the temperature rise area of the coastal power plant according to claim 1, wherein when a number of the water temperature reference stations is greater than or equal to 2, linear relationships of the environmental background water temperatures of each of the water temperature reference stations and the plurality of other water temperature observation stations are built respectively, and verification analyses are carried out one by one, and an environmental background water temperature of the water temperature reference stations with a best linear relationship fitting relationship and a smallest mean square error is selected to reckon the environmental background water temperatures of the plurality of other water temperature observation stations.

5. The method for reckoning the environmental background water temperatures in the temperature rise area of the coastal power plant according to claim 1, further comprising carrying out a continuous observation and carrying out a linear relationship coefficient correction before the operation of the coastal power plant.

6. A method for calculating an actual temperature rise in the temperature rise area of the coastal power plant as recited in claim 1, comprising:

Step01, reckoning an environmental background water temperature of each of the plurality of other water temperature observation stations by using the method according to claim 1;

Step02, after the operation of the coastal power plant, measuring on-site absolute water temperatures at positions of the plurality of other water temperature observation stations;

Step03, a difference value between an on-site absolute water temperature of each other water temperature observation station and a reckoned environmental background water temperature is an actual temperature rise of each other water temperature observation station; and Step04, obtaining an actual temperature rise distribution in a water discharge port area by the actual temperature rise reckoned of an other water temperature observation station position.

7. The method for calculating the actual temperature rise in the temperature rise area of the coastal power plant according to claim 6, further comprising obtaining a temperature rise field distribution surrounding a water discharge port by combining an absolute water temperature distribution obtained by a satellite and/or an aviation remote sensing.

* * * * *